United States Patent
Solomko et al.

(10) Patent No.: US 9,917,575 B2
(45) Date of Patent: Mar. 13, 2018

(54) CIRCUIT COMPRISING AN ACCELERATING ELEMENT

(71) Applicant: Infineon Technologies AG, Neubiberg (DE)

(72) Inventors: Valentyn Solomko, Munich (DE); Winfried Bakalski, Munich (DE); Nikolay Ilkov, Munich (DE); Werner Simbuerger, Haar (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/937,075

(22) Filed: Jul. 8, 2013

(65) Prior Publication Data
US 2015/0008972 A1 Jan. 8, 2015

(51) Int. Cl.
*H03K 17/687* (2006.01)
*H03K 17/042* (2006.01)

(52) U.S. Cl.
CPC .............. *H03K 17/04206* (2013.01)

(58) Field of Classification Search
CPC ................................. H03K 17/04206
USPC ................................. 327/427–434
See application file for complete search history.

(56) References Cited

U.S. PATENT DOCUMENTS

| 5,717,356 A | * | 2/1998 | Kohama | H03K 17/063 327/365 |
| 7,362,147 B2 | | 4/2008 | Rebholz-Goldmann | |
| 7,868,683 B2 | | 1/2011 | Ilkov | |
| 9,048,829 B2 | * | 6/2015 | Kobayashi | H03K 17/0822 |
| 2010/0052637 A1 | * | 3/2010 | Lorentz | G01R 19/0092 323/282 |
| 2010/0283515 A1 | | 11/2010 | Kelley et al. | |
| 2011/0148376 A1 | | 6/2011 | Xu et al. | |
| 2014/0062575 A1 | * | 3/2014 | Hurwitz | H03K 17/161 327/379 |

FOREIGN PATENT DOCUMENTS

| JP | 2013516155 A | 5/2013 |
| JP | 2013110515 A | 6/2013 |
| KR | 1020060128723 A | 12/2006 |

* cited by examiner

*Primary Examiner* — Lincoln Donovan
*Assistant Examiner* — Metasebia Retebo
(74) *Attorney, Agent, or Firm* — Slater Matsil, LLP

(57) ABSTRACT

A circuit includes a switching element with a first terminal, a second terminal and a control terminal. The circuit also includes an impedance network coupled between the control terminal and a switching node. The circuit also includes a first accelerating element coupled between the control terminal and a first node. The first node is different from the switching node. The circuit is configured to temporarily activate the first accelerating element when a switching state of the switching element is to be changed.

34 Claims, 20 Drawing Sheets

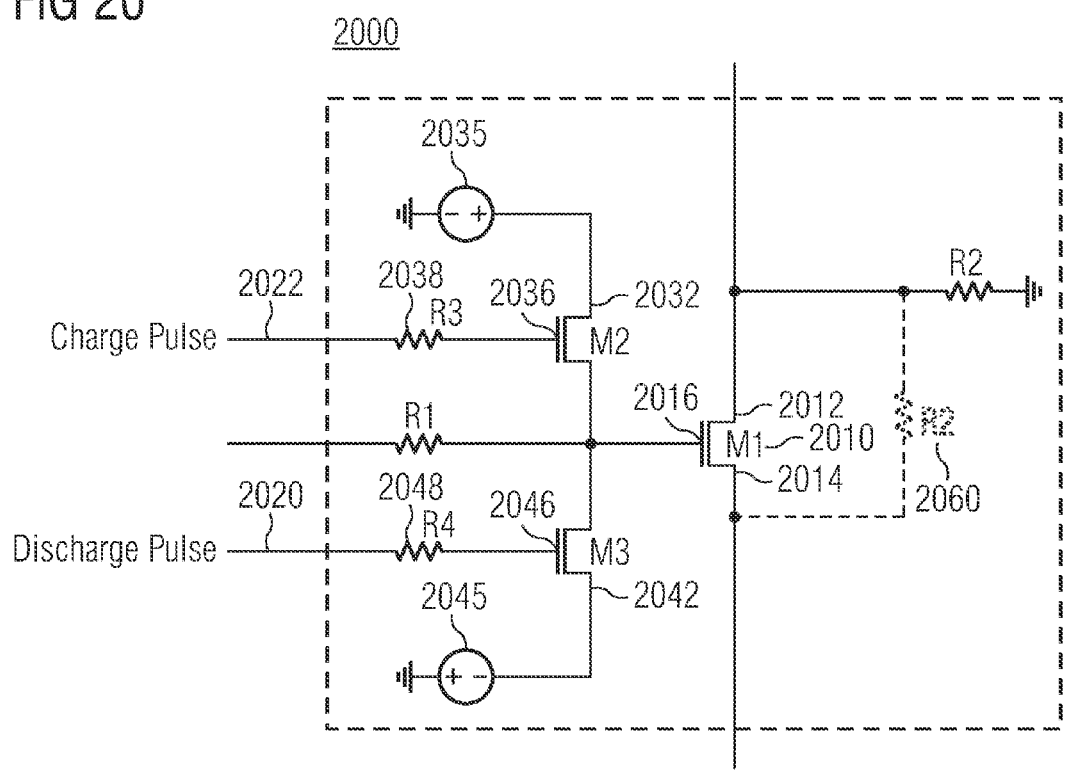
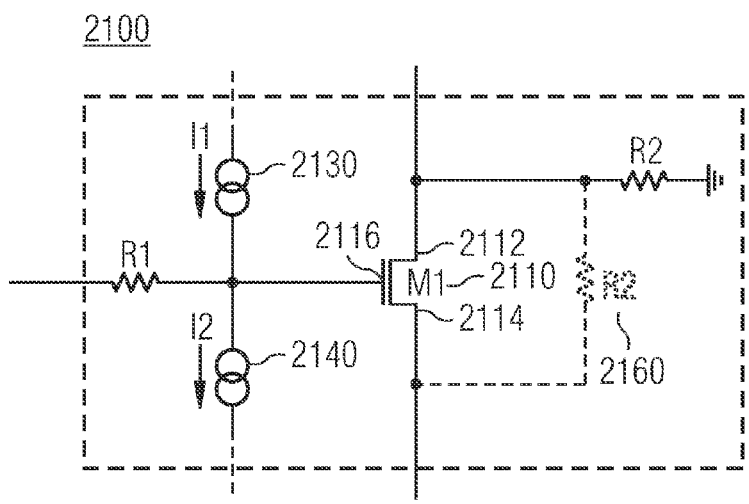

CIRCUIT COMPRISING AN ACCELERATING ELEMENT

TECHNICAL FIELD

Embodiments relate to a circuit comprising an accelerating element. Further embodiments relate to a method for switching a circuit with an accelerating element.

BACKGROUND

In many applications, it is desirable to switch analog or digital signals. For example, in radio frequency switches, a path, via which a radio frequency signal is routed, is opened or closed. However, in modern systems a rapid switching between different states of a switch (for example, a radio frequency switch) is desired, or even required. Moreover, it is also desired to have a small attenuation (or insertion loss) of the switch in the "on" state and good isolation in the "off" state. However, reaching fast switching times is not easy in many case. Thus, it is desirable to create a concept which brings along a fast switching time.

SUMMARY OF THE INVENTION

An embodiment of the invention provides a circuit, comprising a switching element with a first terminal, a second terminal and a control terminal, an impedance network coupled between the control terminal and a switching node, and a first accelerating element coupled between the control terminal and a first node, the first node being different from the switching node. The circuit is configured to temporarily activate the first accelerating element when a switching state of the switching element is to be changed.

An embodiment of the invention provides a circuit, comprising a switching element with a first terminal, a second terminal and a control terminal. The circuit further comprises a first accelerating element which is coupled between the control terminal and the first terminal of the switching element and, optionally, a second accelerating element which is coupled between the control terminal and the second terminal of the switching element. The circuit is configured to temporarily activate at least one of the accelerating elements when a switching state of the switching element is to be changed.

An embodiment of the invention provides a radio frequency switch. The radio frequency switch comprises a first circuit as previously described and a second circuit as previously described. The switching element of the first circuit and the switching element of the second circuit are circuited in series.

An embodiment according to the invention provides a circuit comprising a field effect transistor (FET) with a drain terminal, a source terminal and a gate terminal. The circuit also comprises a first accelerating element which is coupled between the gate terminal and the drain terminal of the FET and a second accelerating element which is coupled between the gate terminal and the source terminal of the FET. The circuit also comprises a control resistor (or, more generally, an impedance network) coupled between the gate terminal of the FET and a control circuit for providing a switching signal and a resistor coupled between the drain terminal of the switching element and a reference potential. The circuit is configured to temporarily activate both the first accelerating element and the second accelerating for a change from a first switching state of the FET to a second switching state of the FET, and to temporarily activate both the first accelerating element and the second accelerating element for a change from the second switching state of the FET to the first switching state of the FET.

A further embodiment according to the invention creates a method for switching a circuit comprising a switching element with a first terminal, a second terminal and a control terminal. The method comprises temporarily activating a first accelerating element, which is coupled between the control terminal and the first terminal of the switching element, and/or a second accelerating element which is coupled between the control terminal and the second terminal of the switching element, when a switching state of the switching element is to be changed.

BRIEF DESCRIPTION OF THE DRAWINGS

Embodiments of the present invention are described herein, making reference to the appended drawings.

FIG. 20 shows a circuit diagram of a circuit 2000 according to an embodiment;

FIG. 21 shows a circuit diagram of a circuit 2100 according to an embodiment;

Figure 1:
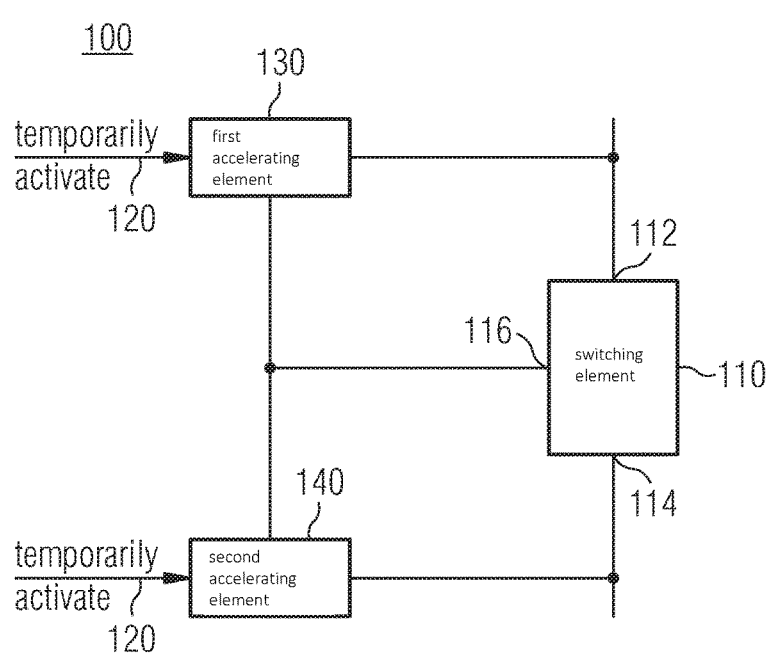
FIG. 1 shows a block diagram of a circuit 100 according to an embodiment.

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

The term "voltage" can also be referred to as "potential" or "voltage potential" and the term "voltage difference" also as "potential difference" or "voltage potential difference". In the following description, voltages are described with respect to a reference voltage.

Embodiments of the circuits may comprise transistors of any transistor technology, for example field-effect transistor technology (FET) or bipolar transistor technology. Therefore, the following technology-independent terms are used for describing the respective transistor terminals: "control terminal" designates a gate terminal or base terminal, "first terminal" designates a source terminal or emitter terminal, and "second terminal" designates a drain terminal or a collector terminal.

FIG. 1 shows a block diagram of a circuit 100 according to an embodiment. The circuit 100 comprises a switching element 110, a first accelerating element 130 and a second accelerating element 140. The switching element 110 comprises a first terminal 112, a second terminal 114 and a control terminal 116. The first accelerating element 130 is coupled between the control terminal 116 and the first terminal 112 of the switching element 110 (wherein the first terminal of the switching element may be considered, for example, as a "first node"). The second accelerating element 140 is coupled between the control terminal 116 and the second terminal 114 of the switching element 110. The circuit 100 is configured to temporarily activate at least one of the accelerating elements 130, 140 when a switching state of the switching element 110 is to be changed.

The switching state of the switching element 110 might be changed between a first switching state and a second switching state.

In the first switching state, for example, the switching element 110 is controlled to activate a path for a signal, which is applied between the first terminal 112 and the second terminal 114 of the switching element 110. To activate the path means, the switching element may be brought in a conductive condition (e.g., low resistance) between the first terminal 112 and the second terminal 114 of the switching element 110, which allows the signal to flow through the switching element 110.

In the second switching state, for example, the switching element 110 is controlled to deactivate the path for a signal, between the first terminal 112 and the second terminal 114 of the switching element 110. To deactivate the path means, to bring the switching element 110 in a nonconductive condition (e.g., high resistance) between the first terminal 112 and the second terminal 114 of the switching element 110, and to prevent the signal from flowing through the switching element 110.

The discharge elements 130 may, for example, produce a low-impedance connection between the first terminal 112 and the control terminal 116 of the switching element 110 and a low-impedance connection between the second terminal 114 and the control terminal 116 of the switching element 110. This allows to discharge charge carriers which are still available (or stored) in the switching element 110 during a change of the switching state of the switching element 110. The low-impedance connection is, for example, a "short-circuit".

The temporary activation of the accelerating elements 130, 140 may, for example, last as long as the switching element 110 (or a specific capacitance, like for example a gate-source capacitance or a drain-source capacitance) is not discharged, or may, for example, last for a predetermined duration.

Figure 2:
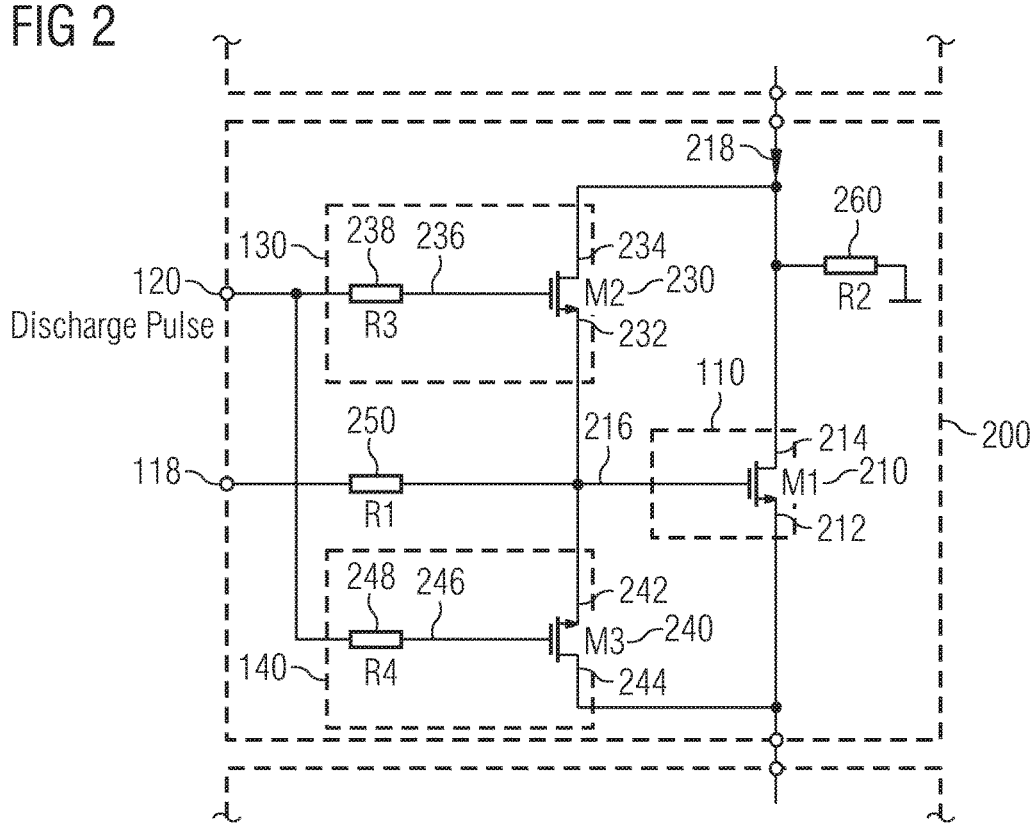
FIG. 2 shows a circuit diagram of a circuit 200 according to an embodiment.

FIG. 2 shows a circuit diagram of an embodiment of a switching circuit comprising an accelerating discharge circuit 200. The circuit comprises a switching element 110, a first accelerating element 130 and a second accelerating element 140. The switching element 110 comprises a first transistor M1 210 with a first terminal 112 which is a source terminal 212, a second terminal 114 which is a drain terminal 214 and a control terminal 116 which is a gate terminal 216.

The first accelerating element 130 comprises a second transistor M2 230, with a source terminal 232, a drain terminal 234 and a gate terminal 236. The first accelerating element 130 further comprise a resister R3 238 which is connected between the gate terminal 236 of M2 and a discharge pulse terminal 120, where a discharge pulse can be applied.

The second accelerating element 140 comprises a third transistor M3 240 with a source terminal 242, a drain terminal 244 and a gate terminal 246. The second accelerating element 140 further comprises a resister R4 248 which is connected between the gate terminal 246 of M3 and the discharge pulse terminal 120, where a discharge pulse can be applied.

The drain terminal 214 of M1 is connected with the drain terminal 234 of M2 and the gate terminal 216 of M1 is connected with the source terminal 232 of M2.

The source terminal 212 of M1 is connected with the drain terminal 244 of M3 and the gate terminal 216 of M1 is connected with the source terminal 242 of M3.

The control terminals of the second transistor and the control terminals of the third transistor may be electrically connected, for example with the resistors R3, R4 circuited in between.

The circuit further comprises a radio frequency (RF) current path 218 where an RF-signal can be applied. The RF current path 218 extends between the source terminal 212 of M1 and the drain terminal 214 of M1.

The circuit 200 further comprises a resistor R1 250 and a resistor R2 260. The resistor R1 250 is connected between the gate terminal 216 of M1 and a control circuit for providing a switching signal (wherein the control circuit is not shown in FIG. 2), and may for example be connected to a switching node ("switch signal") terminal 118. The resistor R2 260 can be connected between the first terminal 212 or the second terminal 214 of the switching element and a reference potential. In FIG. 2 the resistor R2 260 is connected between the drain terminal 214 of M1 and a bias potential. For example, the bias potential may be a ground potential.

The transistors M1 210, M2 230 and M3 240 in the circuit of the FIG. 2 are N-channel MOSFET's. The transistors M1 210, M2 230 and M3 240 can be unipolar transistors preferably field-effect transistors (FET), like for example, metal-oxide-semiconductor field-effect-transistors (MOSFET). The channel width of the transistors M2 230 and M3 240 may, for example, be at least 40 times smaller than a channel width of the transistor M1 210.

A threshold voltage of the field-effect transistor 210 may, for example, be in a range between [−0.7V and +0.7V] or in a range between [−0.5V and +0.5V].

The second transistor 230 and the third transistor 240 can be both of the same channel type. For example, both are N-type unipolar transistors or both are P-type unipolar transistors.

When a FET (for example, the FET 210) switches from a conducting to a non-conducting or from a non-conducting to a conducting state, free charge carriers in the transistor have to be reduced or increased. Because of the relatively high capacity of the gate of a FET, many free charge carriers have to be removed from the gate or established in to the gate. The bigger the blocking voltage and current strength of the FET is, the larger is the drain-source channel of the FET. Therefore also the size of the gate terminal of the FET is typically increased, in order to bring the channel of the FET in a conductive or non-conductive state. By increasing the size of gate, the capacity of the gate will also increase and this limits a quick switching of the FET.

In order to switch from a first switching state to a second switching state of the transistor M1 210, the free charge carriers are removed from the gate 216 or moved in to the gate 216. This charge (or discharge) process can be accelerated by a temporary low resistance connection between the gate terminal 216 and the source terminal 212 and/or by a temporary low resistance connection between the gate terminal 216 and the drain terminal 212 of the transistor M1.

A discharge pulse can be applied to the accelerating elements 130, 140. When a discharge pulse is applied at the discharge pulse terminal 120, the FETs M2 230, M3 240 are switched to a conductive condition. As a consequence, a low resistance connection between the gate terminal 216 and the source terminal 212 of M1 and a low resistance connection between the gate terminal 216 and the drain terminal 212 of M1 exist.

On-resistances of the accelerating elements 130, 140 can be smaller than the resistance of the resistor R1 250 connected at the control terminal 116 of the switching element 110 or can be smaller than 1/10 or 1/100 or 1/1000 of the resistance of the resistor R1 250 of the control terminal 116.

The time period of the low resistance connection between the source 212, the drain 214 and the gate 216 should be as short that it does not disturb a new switching state of the switch transistor M1 210. In a preferred embodiment, the time period during which the FET's M2 230 and M3 240 are activated, is smaller than an RC-time constant of the control resistor R1 250 and the capacitance of the gate 216 of M1, or the time period may, be smaller than one tenth of the RC-time constant, or the time period may, for example, be smaller than 1/50 of the RC-time constant.

By discharging the gate-drain capacitance and gate-source capacitance, which can be reached by activating the transistors M2 230 and M3 240, the gate potential of transistor M1 210 is quickly brought close to a threshold potential. However, since the discharge curve of the gate-drain capacitance and of the gate-source capacitance shows an approximately exponential characteristic, a "steady state" value (or end value) is reached slowly. However, a gate-drain capacitance or a gate-source capacitance can be considered as being substantially discharged when the magnitude of the gate-drain voltage or of the gate-source voltage falls below, for example, 100 millivolt.

After discharging, or at least substantially discharging, the gate 216 of M1 the discharge pulse can be deactivated. Thereby the FETs M2 230, M3 240 are switched to a nonconductive condition. As consequence of this, a high resistance connection between the gate terminal 216 and the source terminal 212 of M1 and a high resistance between the gate terminal 216 and the drain terminal 214 of M1 will be reestablished. The gate 216 of M1 can be further charged to its steady-state on-value or its steady-state off-value via R1 250.

In order to operate the transistor M1 in a linear range, a certain voltage, applied between the source terminal 212 and drain terminal 214 should not be exceeded. To be able to switch greater voltages, a plurality of switching transistor units 200 may be stacked in series to each other.

In other words, two small discharge transistors M2 230 and M3 240 are placed in between the gate 216 and source 212, and in between the gate 216 and drain 214 of each stacked switching transistor M1 210. A resistor R3 238 and R4 248, respectively, is placed between a control terminal 236, 246 of the discharge transistor M2 230, M3 240 and a control circuitry. Upon switching of the switching transistor 210 (for example, when a level at the switch control terminal is charged) a pulse is applied to discharge transistors M2 230 and M3 240 to discharge the gate 216 of the switching transistor M1 210.

Each switching transistor unit 200 might consist of (or comprise) a switching transistor M1 210, a switching resistor R1 250, a discharge resistor R2 260, two discharge transistors M2 230 and M3 240 connected between gate 216 and drain 214, and between gate 216 and source 212 of M1 210, and two resistors R3 238 and R4 248 connected between gates 236, 246 of the discharge transistors and control logic (not shown in FIG. 2). Each switching transistor unit 200 may be stacked in series with other identical transistor units 200A and 200B. When a control voltage at the switching node 118 changes the recharge current starts flowing through R1 250 into the gate of M1 216. To speed up the charge/discharge process a voltage pulse is applied to the terminal 120 and opens (for example, brings in to a conductive state) transistors M2 230 and M3 240 which discharge the gate of M1 216 to the DC voltage at source 212 and drain 214 of M1. After the gate is discharged the control voltage at the terminal 120 changes, driving M2 230 and M3 240 into the cutoff region. The gate of M1 216 continues charging through R1 250. The R3-Cg2 and R4-Cg3 time constants, with Cg2 and Cg3 being gate capacitances of M2 230 and M3 240 respectively, are significantly lower than a R1-Cg1 time constant with Cg1 being a gate capacitance of M1 210.

Figure 3:
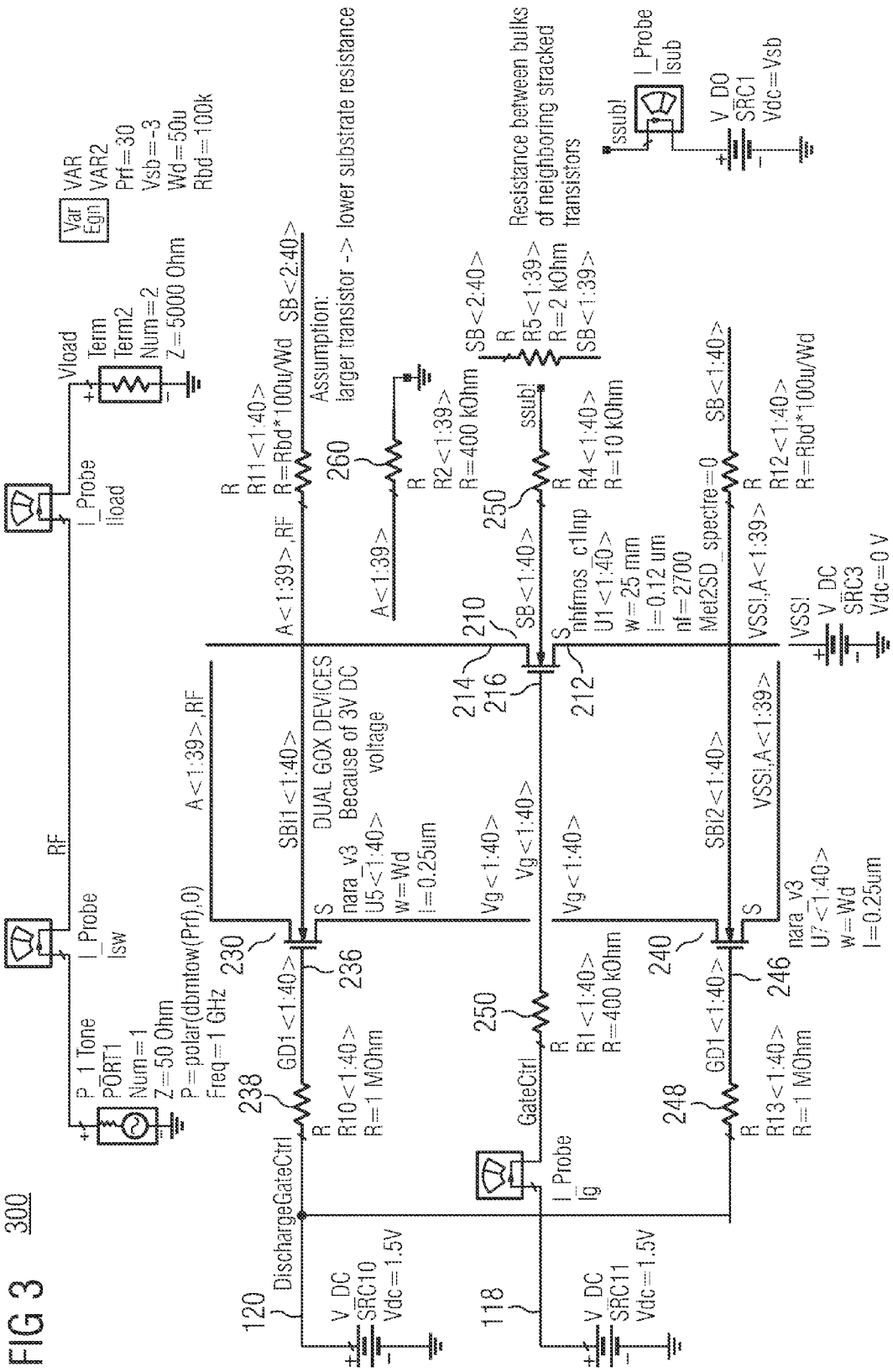
FIG. 3 shows a schematic of a circuit 300 according to an embodiment.

FIG. 3. shows an embodiment of a switching circuit 300 comprising an accelerating discharge circuit. Thereby a transistor U1 210 of the switching circuit and a second and a third transistor U5 230, U7 240 are metal oxide semiconductor field-effect transistors (MOSFET). The channel widths of the second and the third transistors U5 230 and U7 240 are circa 40× smaller than the channel width of U1 210.

A resistor R1 250 is connected between a gate 216 of the transistor U1 and a switching node 118 (GateCtrl). Between a gate 236 of the second transistor U5 and a discharge pulse terminal 120 (DischargeGateCtrl), a resistor R10 238 is circuited, and between a gate 246 of the third transistor U7 and the discharge pulse terminal 120 (DischargeGateCtrl) a resistor R13 248 is circuited. The resistors R10 238 and R13 248 have a value of 1 MΩ. The resistor R1 250 is, by a factor of 2.5, smaller than R10 238 and R13 248 and has a value of 400 kΩ.

A resistor R2 260 is connected between the drain terminal 214 of the transistor U1 and a GND-potential respectively a bias potential. The resistor R2 260 has a value of 400 kΩ.

Some further details, which may be considered as optional, can be seen from FIG. 3.

Figure 4:
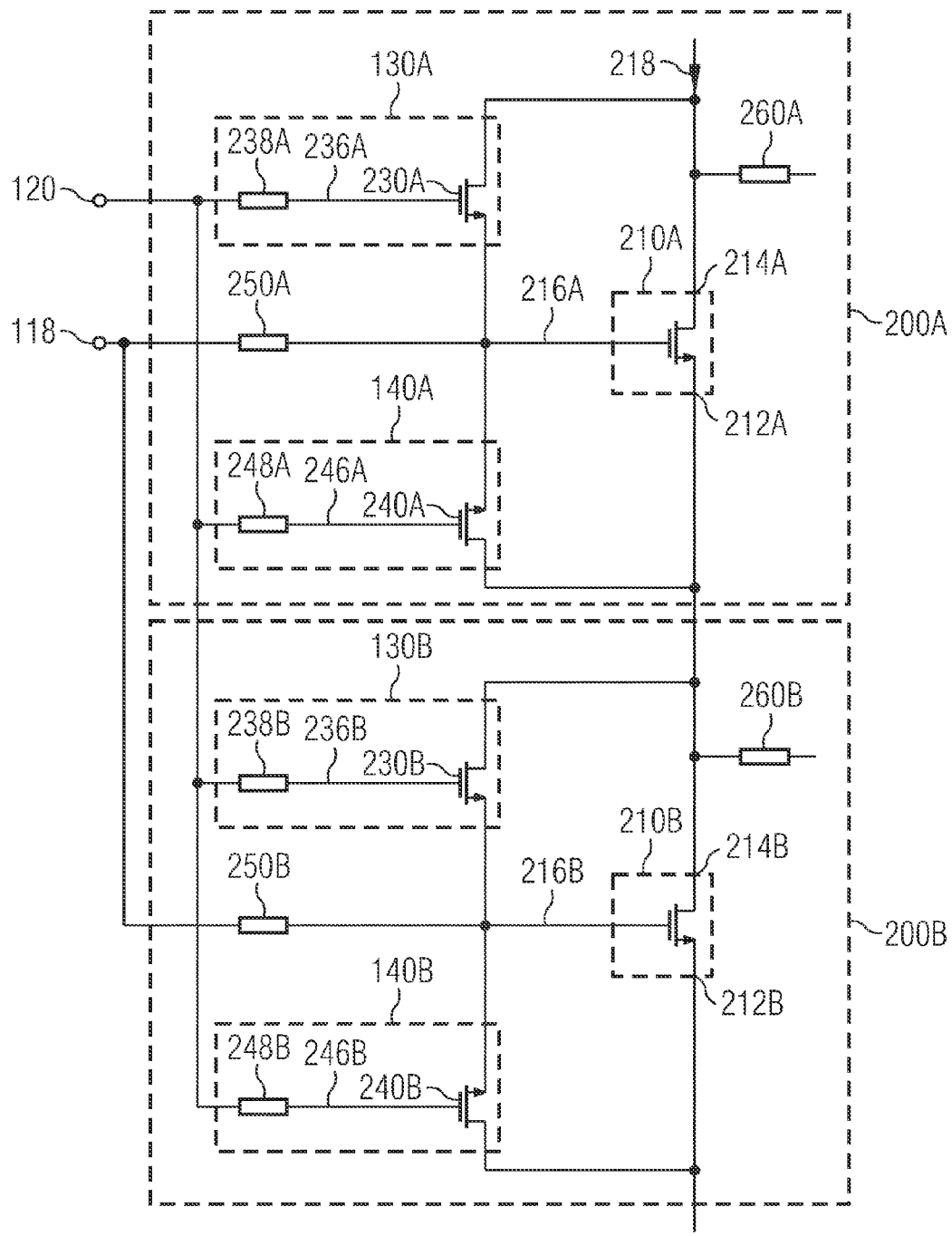
FIG. 4 shows a circuit diagram of an embodiment of stacked circuit 200A, 200B.

FIG. 4. shows two stacked discharge circuits 200A and 200B. Each circuit 200A, 200B comprise a MOSFET as switching element 210A, 210B with a first terminal 212A, 212B, a second terminal 214A, 214B and a control terminal 216A, 216B. Further, each circuit 200A, 200B comprises a second transistor 230A, 230B and a third transistor 240A, 240B.

A respective first accelerating element 130A, 130B is between the control terminal 216A, 216B and the second terminal 214A, 214B of the respective switching element 210A, 210B and a respective second accelerating element 140A, 140B is connected between the control terminal 216A, 216B and the first terminal 212A, 212B of the respective switching element 210A, 210B.

Each accelerating element comprises a MOSFET 236A, 246A, 236B, 246B and a resistor 238A, 248A, 238B, 248B. The resistors 238A, 248A, 238B, 248B can be connected between the terminal 120 which provides a discharge pulse and a gate of the MOSFETs 236A, 246A, 236B, 246B. The discharge pulse Terminal 120 can be directly connected to each accelerating element 130A, 140A, 130B, 140B.

A resistor 250A, 250B is connected between each control terminal 216A, 216B of the switching element 210A, 210B and the switching node 118.

The circuit 400 can be configured to simultaneously activate the accelerating elements 130A, 140A, 130B, 140B of the first circuit 200A and of the second circuit 200B, and to simultaneously provide a switching signal to first circuit 200A and of the second circuit 200B via a common switching node 118.

The second terminal 214A of the switching element 210A of the first circuit 200A can be coupled to a reference potential via a first biasing device 260A. Similarly, the second terminal 214B of the switching element 210B of the second circuit 200B can be coupled to the reference potential via a second biasing device 260B. These biasing devices 260A, 260B have the effects, that the first terminals 212A, 212B or the second terminals 214A, 214B of the switching elements 210A, 210B are biased to the reference potential. The biasing device 260A, 260B in FIG. 4 is a resistor. In a preferred embodiment of the circuit, the biasing devices 260A, 260B can also be inductances or other devices with a low-pass characteristic.

The switching element 210A of the first circuit 200A and the switching element 210B of the second circuit 200B can be circuited in series. More precisely the source terminal 212A of the switching element 210A of the first circuit 200A can be coupled to the drain terminal 214B of the switching element 210B of the second circuit 200B.

Figure 5:
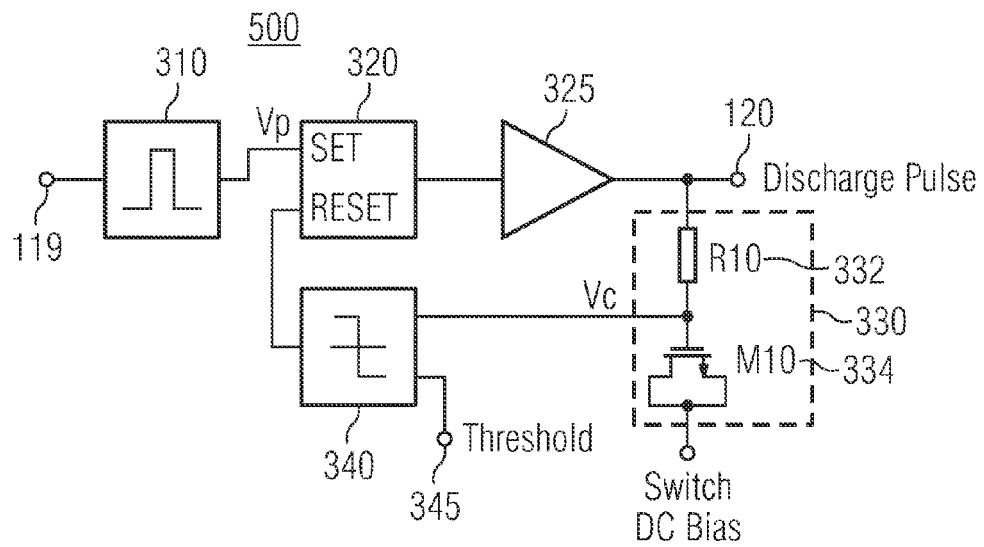
FIG. 5 shows a block diagram of an embodiment of an discharge pulse generator circuit 500.

FIG. 5. Shows a block diagram of a circuit 500 which generates a discharge pulse. The circuit 500 comprises a pulse generator 310, a RS-flip-flop 320, a driver 325, an RC-Element 330 as a low pass filter and a comparator 340. An input port of the pulse generator 310 is connected to a switch state signal terminal 119, where a switch control signal can be provided. An output port of the pulse generator 310 is connected to a Set-terminal of the RS-flip-flop 320. The amplifier 325 is connected between the output port of the RS-flip-flop 320 and a discharge pulse terminal 120.

A feedback of the circuit is connected between the discharge pulse terminal 120 and the reset terminal of the RS-flip-flop 320. The feedback comprises the RC-Element 330 as a low pass filter, whereby a resistor R10 332 is connected to the discharge pulse terminal 120 and to a capacitance M10 334. The capacitance M10 334 is further connected to a bias voltage level. The resistance value of the resistor R10 332 is, for example, similar to the resistor value of the resistors R3 238 and R4 248 of the first and the second accelerating elements 130, 140. The capacity value of the capacitance M10 334 is, for example, identical to the capacity value of one of the transistors 230, 240 of the accelerating element. The capacitance of the RC-Element 330 can be formed by a transistor M10 which is identical, except for a channel width, to a transistor 230, 240 forming one of the accelerating elements.

An input terminal of the comparator 340 is connected between the resistor R10 and the capacitance M10. Another input terminal is connected to a threshold potential. An output terminal of the comparator is connected to a reset terminal of the RS-flip-flop.

The circuit 500 provides a discharge pulse to temporarily activate at least one of the accelerating elements 130, 140. The RS flip-flop 320 may be configured to be set when a switching state of the switching element 110 is to be changed and to be reset when a predetermined state has been reached by the accelerating elements 130, 140.

The RC-Element 330 can be configured to receive a control voltage for one or more of the accelerating elements 130, 140. Wherein the RS flip-flop 320 is configured to be reset when the capacitances 334 of the RC-Element 330 reaches or crosses a predetermined threshold voltage. For example, an RC-time constant of the RC-Element 330 may be equal to an RC-time constant formed by the resistor R3 238 and the gate capacitance of the transistor M2 230 of one of the accelerating elements.

With other words, the circuit which generates the discharge pulse is shown in FIG. 5. The circuitry contains a pulse generator 310, an RS-flip-flop 320, a driver 325, a resistor R10 332 and capacitively-connected transistor M10 334. Both R10 332 and M10 334 may be identical to R3 238 and M2 230. The circuitry also comprises a comparator 340. When the switch control signal changes its logical state a pulse generator 310 generates a short pulse which sets the output of RS-flip-flop 320 into "high" state and the driver 325 starts charging the gates of discharge transistors M2 230 and M3 240 together with M10 334. Once the voltage at M10 334 (and consequently, the voltage at the gates of M2 230 and M3 240) reaches the predetermined threshold voltage 345 the comparator 340 changes its output and resets the RS-flip-flop 320 thus closing the transistors M2 230 and M3 240. The threshold at 345 and sizes of M2 230 and M3 240 are chosen such that the gate 216 of a switching element M1 210 is discharged (or at least substantially discharged) until the reset signal for a RS-flip-flop 320 is generated.

Figure 6:
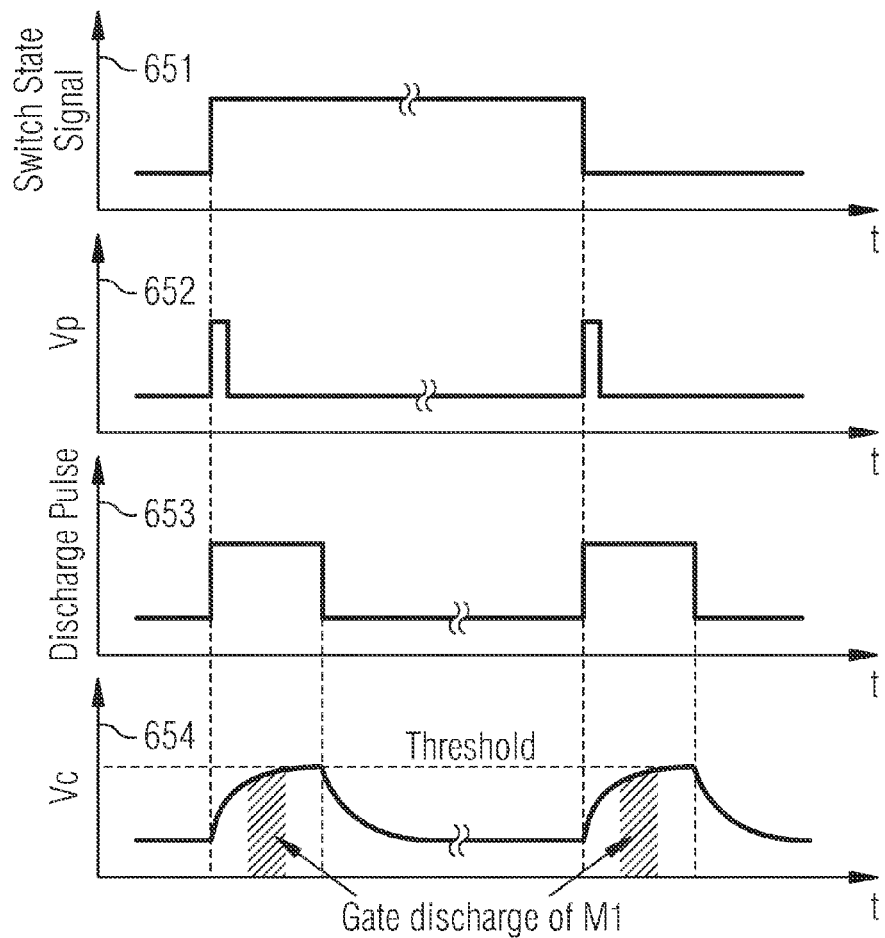
FIG. 6 shows voltage charts from a circuit according to FIG. 5.

FIG. 6 shows several charts from a circuit 500 according to FIG. 5. The first chart 651 shows the voltage at the switch state signal terminal 119. Each change of state generates a needle pulse in the pulse generator 310 as shown in the second chart 652. The needle pulse can set the RS flip-flop 320. The RS flip-flop 320 can be reset when the signal Vc, which is present between the resistor R10 332 and the capacitance of the RC-Element M10 334, achieves a threshold voltage of the comparator 345.

Figure 7:
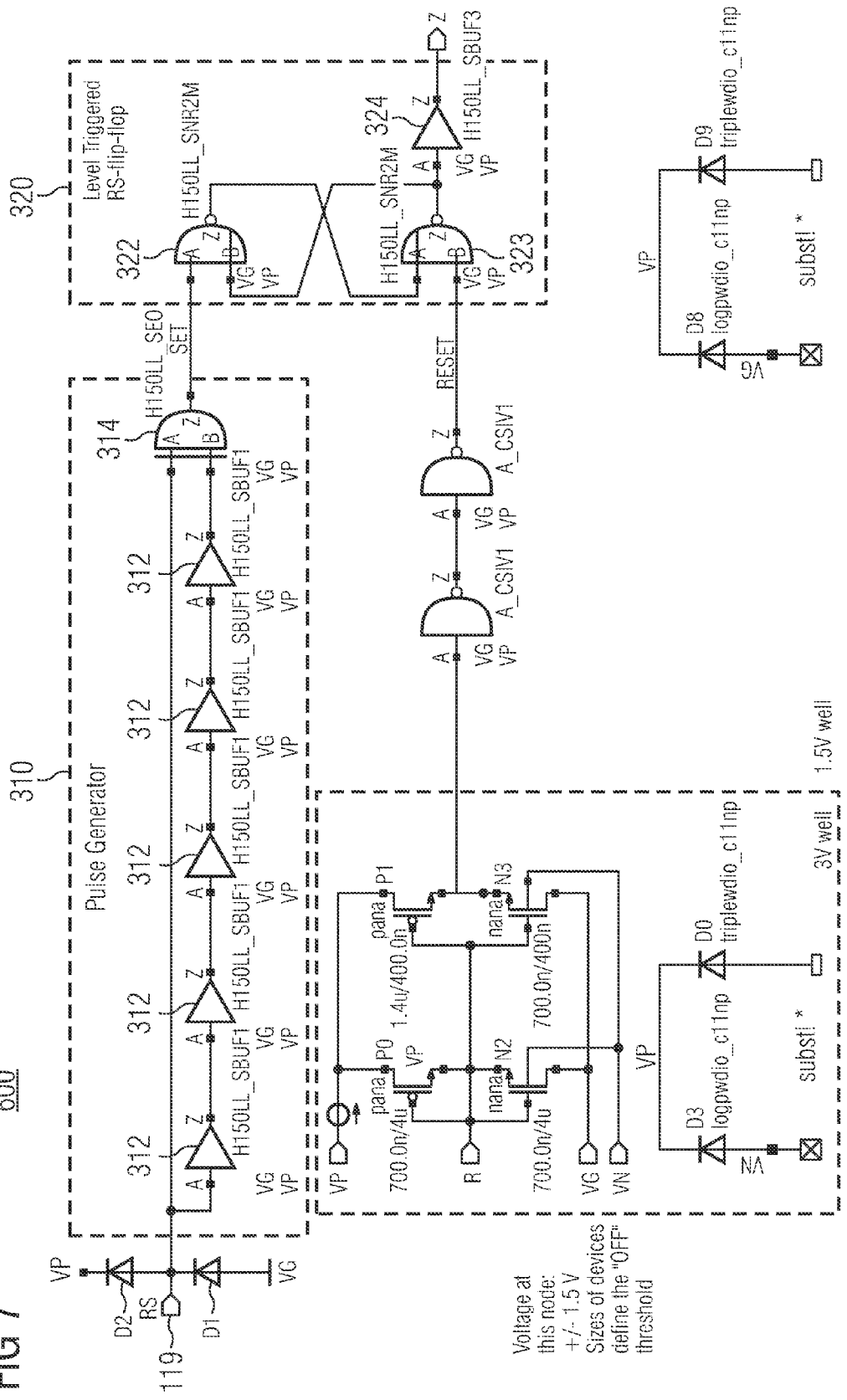
FIG. 7 shows a simulation block diagram 600 of a pulse generator and a RS flip-flop.

FIG. 7 shows a circuit diagram 600 of an embodiment of a pulse generator 310 and an RS flip-flop 320. The pulse generator 310 can comprises several inverters or drivers 312 connected in serial. The quantity of inverters 312 may be an even number. The quantity of drivers 312 may be an odd number. The circuit 600, for example, has 5 drivers 312 connected in serial. An input terminal of the first driver 312 is connected to a switching state signal terminal 119. An output terminal of the last inverter is connected to an input terminal of an EXOR-Gate 314. The other input terminal of the EXOR-Gate 314 is connected to the switching state signal terminal 119.

The RS flip-flop 320 comprises two NOR-Gates 322,323, whereby the output terminal of a first NOR-Gate 322 is connected to a input terminal of a second NOR-Gate 323 and wherein a output terminal of the second NOR-Gate 323 is connected with a input terminal of the first NOR-Gate 322. The other input terminal of the first NOR-Gate 322 is the set terminal of the RS flip-flop 320. The Set terminal is connected with the output terminal of the EXOR-Gate 314 of the pulse generator 310. The other input terminal of the second NOR-Gate 323 is the Reset terminal of the RS flip-flop 310. An Inverter or Driver 324 is connected between the output terminal of the second NOR-Gate 232 and a Z-terminal where a discharge pulse for the discharge pulse terminal 120 is provided.

Some further details, which may be considered as optional, can be seen from FIG. 7.

Figure 8:
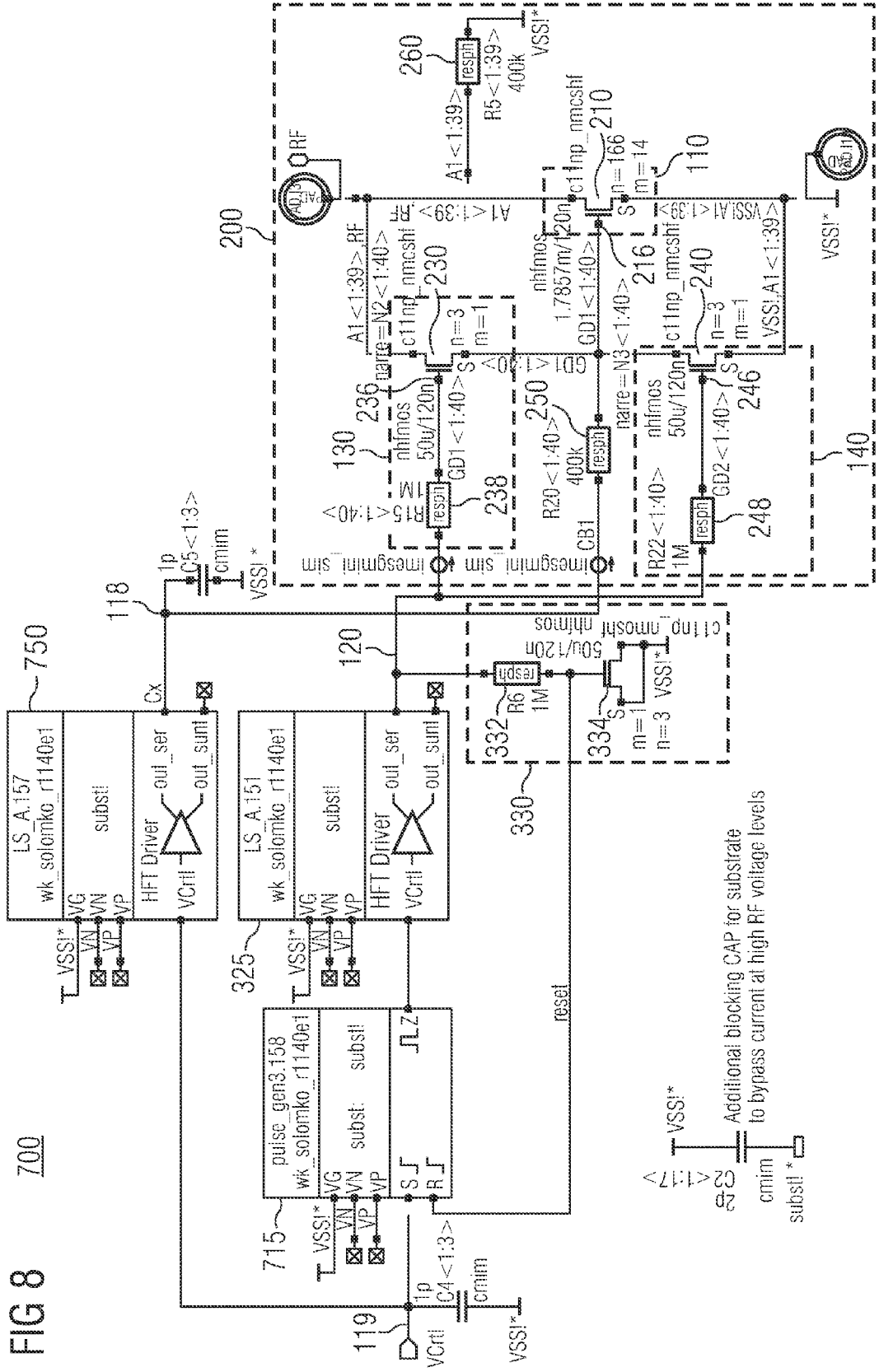
FIG. 8 shows a simulation block diagram of a circuit 700 according to an embodiment.

FIG. 8 shows a simulation block diagram of a circuit 800 according to an embodiment. The circuit comprises a transistor as switching element A1 210 and two transistors as accelerating elements N2 230, N3 240. The transistor A1 210 and the second and the third transistors N2 230, N3 240 are similar to the switching element and the accelerating element shows in prior mentioned Figures. It is possible to use transistors 210, 230, 240 in the circuits with different values.

Further, the circuit comprises a control resistor R20 250 which is connected between the control terminal 216 of the switching element A1 210 and the switching node 118. The control resistor R20 250 is similar to the control resistors 250 show in the figures described above. It is possible to use resistors 250 in the circuits with different values.

Further devices, like for example, the resistors 238, 248 of the accelerating elements 230, 240, the resistor 260, the RS flip-flop 320 are similar to the devices shows in the figures described above. Also it is possible to use different kinds of similar devices with different values in different embodiments such that the values shown herein should considered as examples only.

The circuit in FIG. 8 comprises in addition, an inverting or non-inverting switching signal driver 750 configured to provide the switching signal at the switching node 118 on the basis of the switch state signal at the switch state signal terminal 119.

Between the control terminal 236 and 246 of the second and the third transistor and the discharge pulse terminal 120, the resistors R15 238 and R22 248 are circuited.

A discharge pulse signal can be provided by the RS-pulse generator 715 which comprise the pulse generator 310 and the RS flip-flop 320. Said signal can be an input signal of a driver 325, whereby the output signal oft the driver 325 is connected to a RC-element 330 and the discharge pulse terminal 120. The RC-element 330 has a feedback to the RS-pulse generator.

The RS-pulse generator 715 provides a pulse to temporarily activate at least one of the accelerating elements 130, 140, wherein the RS-pulse generator 715 is configured to be set when a switching state of the switching element 110 is to be changed and wherein the RS-pulse generator 715 is configured to be reset when a predetermined state has been reached by the accelerating elements 130, 140.

The circuit 700 can, for example, be configured to activate both the first accelerating element 130 and the second accelerating element 140 for a change from a first switching state, for example an ON-state, of the switching element 110 to a second switching state of the switching element 110, and to activate both the first accelerating element 130 and the second accelerating element 140 for a change from the second switching state, for example an OFF-state, of the switching element 110 to the first switching state of the switching element 110.

In the circuit 700 a discharge pulse can be generated. The circuit may be configured to terminate the discharge pulse when a predetermined state has been reached by the accelerating elements 130, 140. The discharge pulse continues during a time period which is long enough to discharge the capacitances between the control terminal 116, the first terminal 112 and the second terminal 114 of the switching element 110 down to less than 10% of the initial charge.

The circuit can be configured to temporarily activate at least one of the accelerating elements 130, 140 in response to a transition of a switch state signal, and to provide a switching signal, which is coupled to the control terminal 116 of the switching element via a control resistor 250, on the basis of the switch state signal, or to couple the switch state signal to the control terminal 116 of the switching element via the control resistor 250.

The circuit 700 can be configured to provide the switching signal, which is coupled to the control terminal 116 of the switching element via the control resistor 250, such that a state of the switching signal is determined by a state of the switch state signal.

In the following, some additional explanations will be provided which facilitate the understanding of the presentation.

Figure 9:
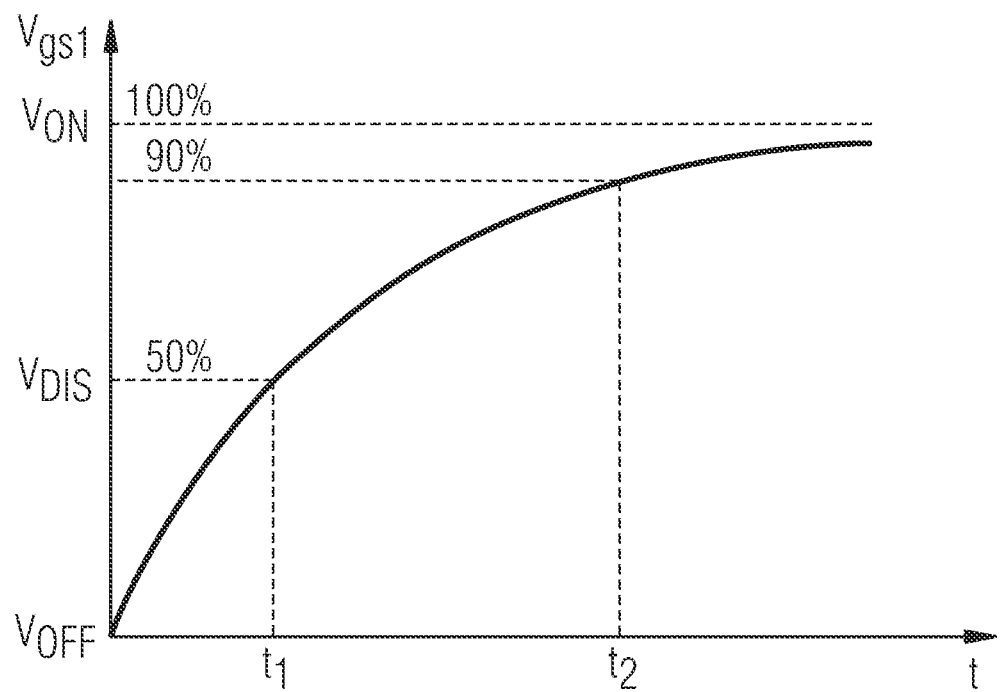
FIG. 9 shows a step response of an RC circuit.

FIG. 9 shows a step response of an RC circuit. During the switching transition of a switching element without discharge transistors the gate-source voltage can be approximated with such a RC circuit step response. The step response for the gate-source voltage Vgs1 is equivalent to:

$$V_{gs1}(t) = (V_{ON} - V_{OFF})\left(1 - e^{-\frac{t}{R_1 C_{g1}}}\right) + V_{OFF}$$

where $V_{ON}$ is the gate-source DC voltage in the "ON" state, and $V_{OFF}$ is the gate-source DC voltage in the "OFF" state. Assuming that $V_{ON}$ and $V_{OFF}$ are spaced equally apart from the discharged gate-source voltage $V_{DIS}$, (which may be the case in some embodiments according to the invention within a tolerance of ±100 mV or ±250 mV) as shown in FIG. 9, one can write:

$$t_1 = -R_1 C_{g1} \ln(0.5)$$

$$t_2 = -R_1 C_{g1} \ln(0.1)$$

where $t_1$ and $t_2$ represent the time when the gate of a switching element 110 is charged to 50% of the final voltage and 90% of the final voltage ("ON"-state). By using discharge elements 130, 140 the total time to achieve 90% of the final voltage can be reduced by:

$$\frac{t_1}{t_2} = \frac{\ln(0.5)}{\ln(0.1)} = 0.3 = 30\%$$

This is due to the fast that 50% of the finale (steady state) gate voltage (i.e., the discharge gate-source voltage) are reached very fast by activating the accelerating elements.

Figure 10:
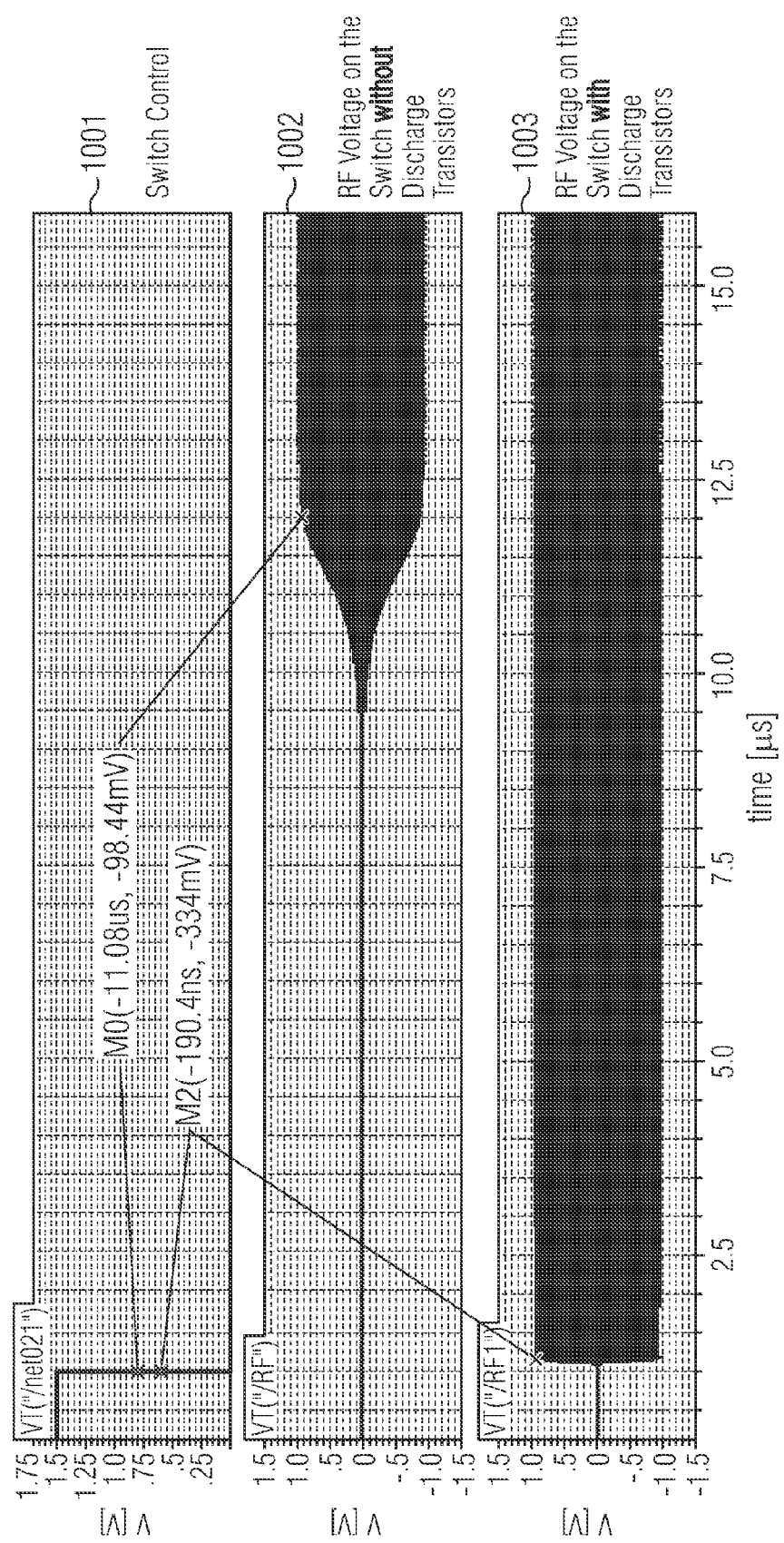
FIG. 10 shows a time reduction for a switching transition from an OFF-State to an ON-State.

FIG. 10 shows in a first chart 1001 the voltage at the switching node 118 for a switching transition from an OFF-State to an ON-State. The second chart 1002 shows a RF voltage without discharging elements 130, 140 where a significant delay can be noted. The third chart 1003 shows an RF voltage on the switching element 110 with discharging elements 130, 140 when a delay is smaller than in the case without discharging elements (accelerating elements).

Figure 11:
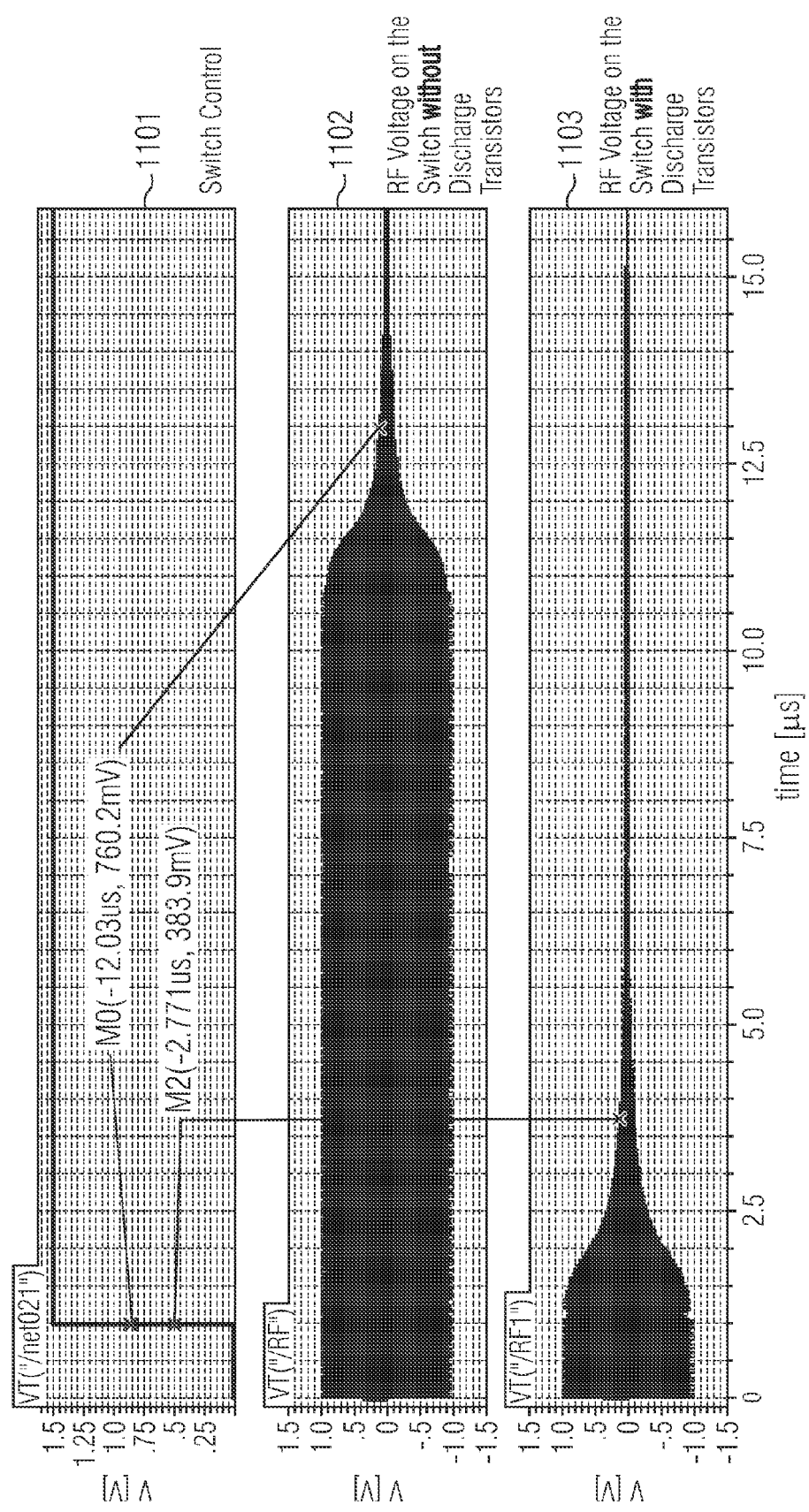
FIG. 11 shows a time reduction for a switching transition from an ON-State to an OFF-State.

FIG. 11 shows in a first chart 1101 the voltage at the switching node 118 for a switching transition from an ON-State to an OFF-State. The second chart 1102 shows a RF voltage on the switch without discharging elements 130, 140, where a significant delay can be noted. The third chart 1103 shows a RF voltage on the switch with discharge elements 130, 140.

The FIGS. 10 and 11 demonstrate an example of actual switching time reduction in one SPST (single pole single through) embodiment. The switching time, defined as a time difference between applied control signal and 90% or 10% of settled RF amplitude at the switch, is reduced for "ON"-"OFF" and "OFF"-"ON" transitions. The upper graph 1001, 1101 shows the control signal, the middle one shows 1002, 1102 the RF amplitude at the switch without discharge transistors 230, 240, and the lower one 1003, 1103 shows the RF amplitude at the switch with discharge transistors 230, 240.

Figure 12:
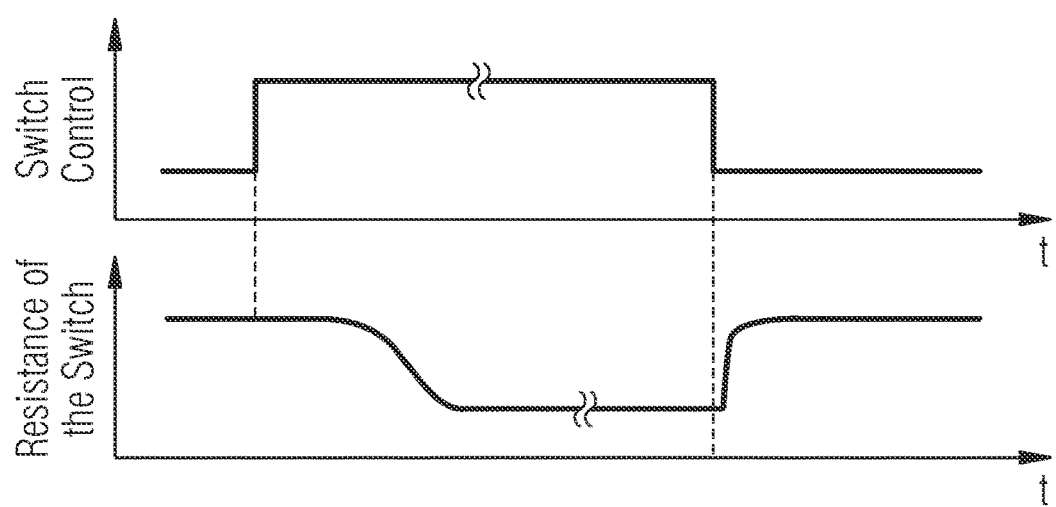
FIG. 12 shows different switching profiles for "ON"-"OFF" and "OFF"-"ON" transitions.

FIG. 12 shows different switching profiles for "ON"-"OFF" and "OFF"-"ON" transitions.

Depending on the threshold voltage of a switching transistor 210 in the proposed structure, different switching profiles for "ON"-"OFF" and "OFF"-"ON" transitions as shown in FIG. 12 could occur.

Figure 13:
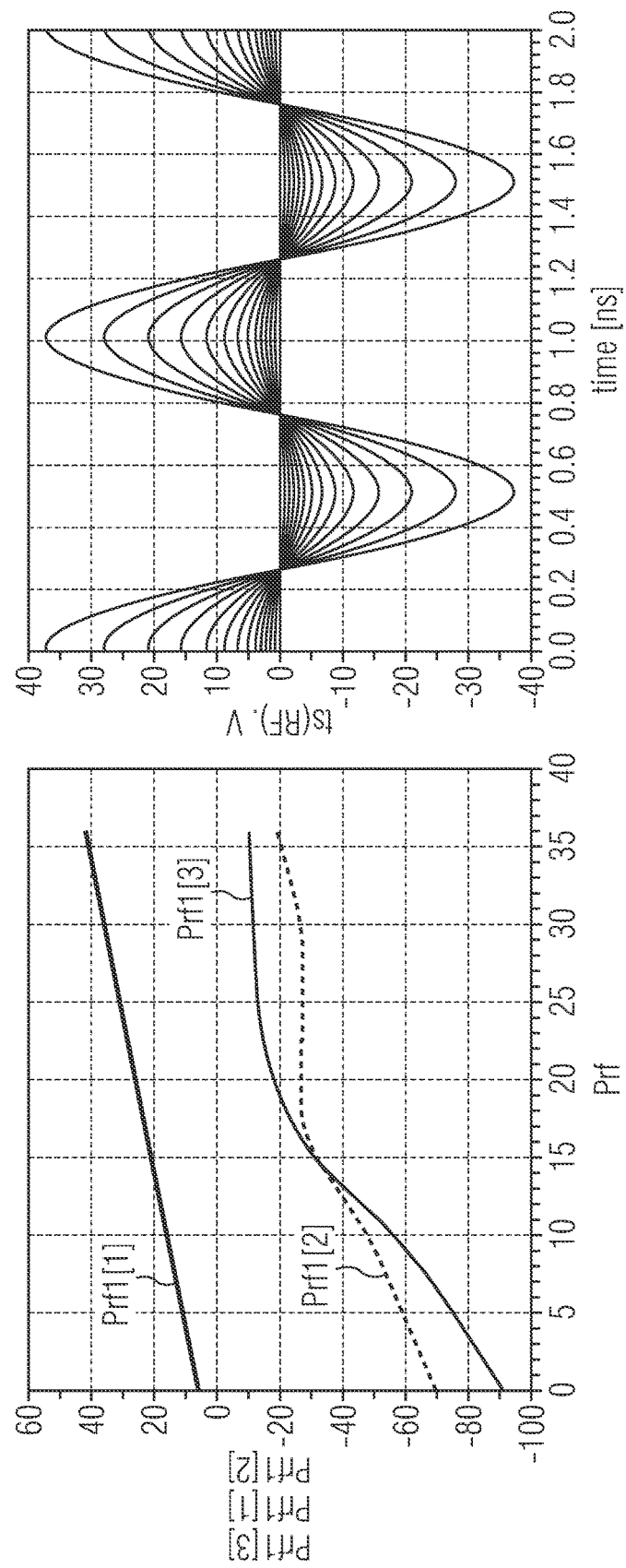
FIG. 13 shows a voltage at "OFF state" switch without discharge transistors.

FIG. 13 shows a voltage at "OFF state" without discharge transistors 230, 240 (VSWR=1:100, high bulk resistance).

Figure 14:
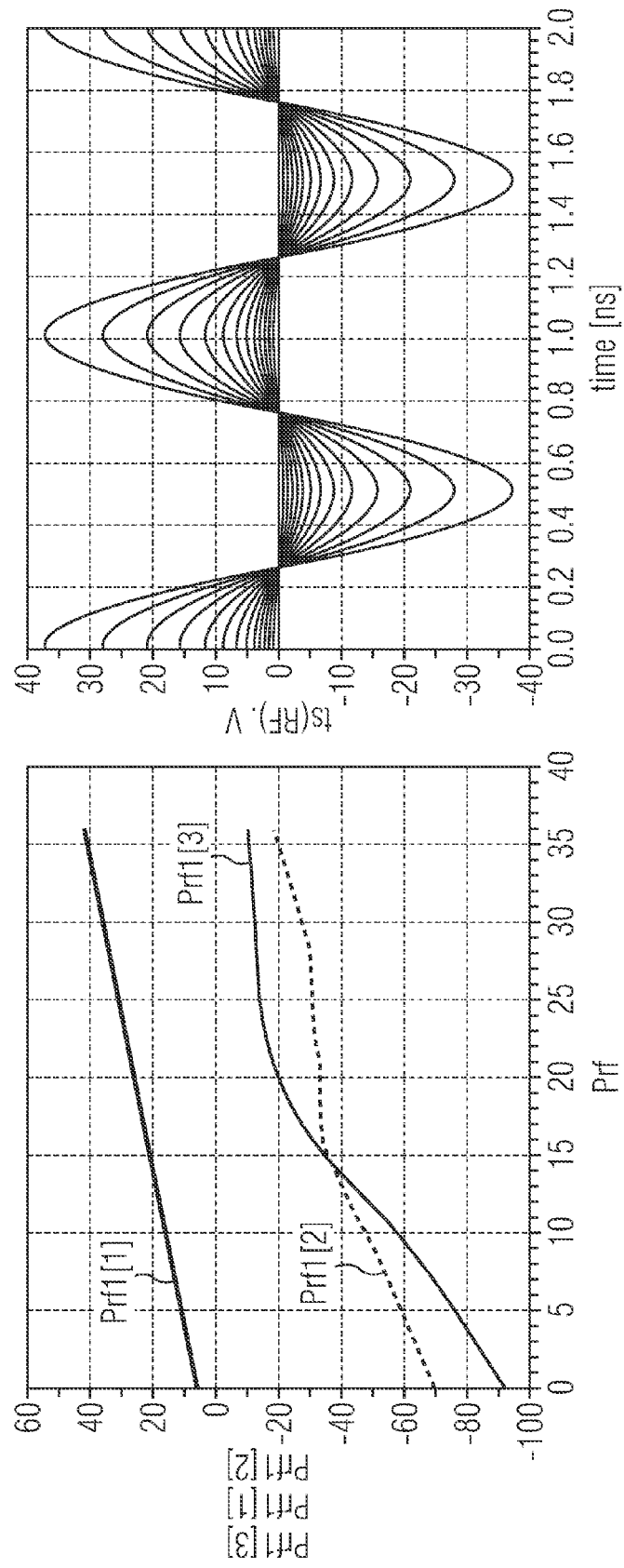
FIG. 14 shows a voltage at "OFF state" switch with discharge transistors.

FIG. 14 shows a voltage at "OFF state" with discharge transistors 230, 240 (VSWR=1:100, high bulk resistance).

Figure 15:
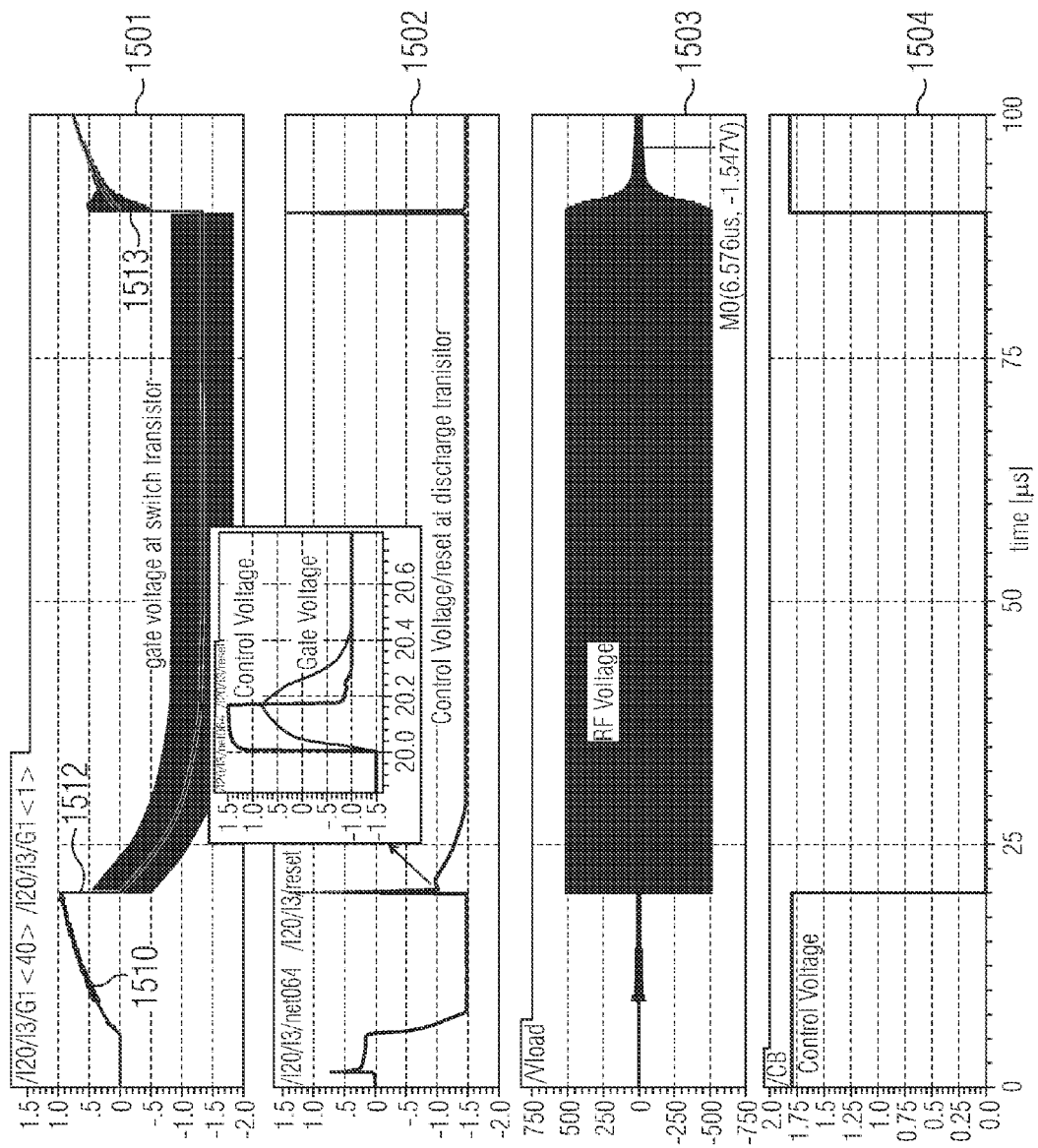
FIG. 15 shows graphic representations of a temporal evolution of voltages in a circuit according to an embodiment.

FIG. 15 shows in a first chart 1501 the voltage at the control terminal 116 of the switching element 110. In the first step the voltage increases from zero to a positive voltage potential. The positive voltage at the gate 216 of a "enhancement" mode N-channel MOSFET, activates (brings in to a conductive state) the RF-channel between the source 212 and the drain terminal 214 as can be seen in the first part 1501 of the third chart of FIG. 15.

When the circuit is switched from the "ON"-state to the "OFF-state the discharge pulse as shown in the second chart 1502 is generated, and an activation of the discharge elements, which is caused by the discharge pulse, discharges the gate 216 to 0V in a short time which can be seen at reference Numeral 1512. Then the voltage at the gate 216 further decreases to a negative voltage potential. As shown in the third chart 1503, the RF signal between the source 212 and the drain 214 increases as soon the gate voltage achieved 0 volt. This value is accurate for enhancement-type N-channel MOSFET, while other types of switching element 110 may have other values. When the voltage at the gate 216 further decreases, the switch still remaining in the "OFF"-state.

When the circuit switched back from the "OFF"-state to the "ON"-state, the second and the third transistor 230, 240 discharge the gate 216 of the transistor 210 from −1.5V to 0 volt which can be seen at reverence Numeral 1513. After discharging the switching element 110 (e.g., discharging a gate capacitance from a gate-source voltage of −1.5 to a gate-source voltage of approximately 0V), which is triggered by the discharge pulse, the voltage starts to increase further to a positive potential wherein the accelerating element is disabled and the gate is charged via R1. Depending of the transistor 210 type, the RF-Voltage between the source 212 and the drain terminal 214 is short-circuited after a designated positive gate voltage is reached.

Figure 16:
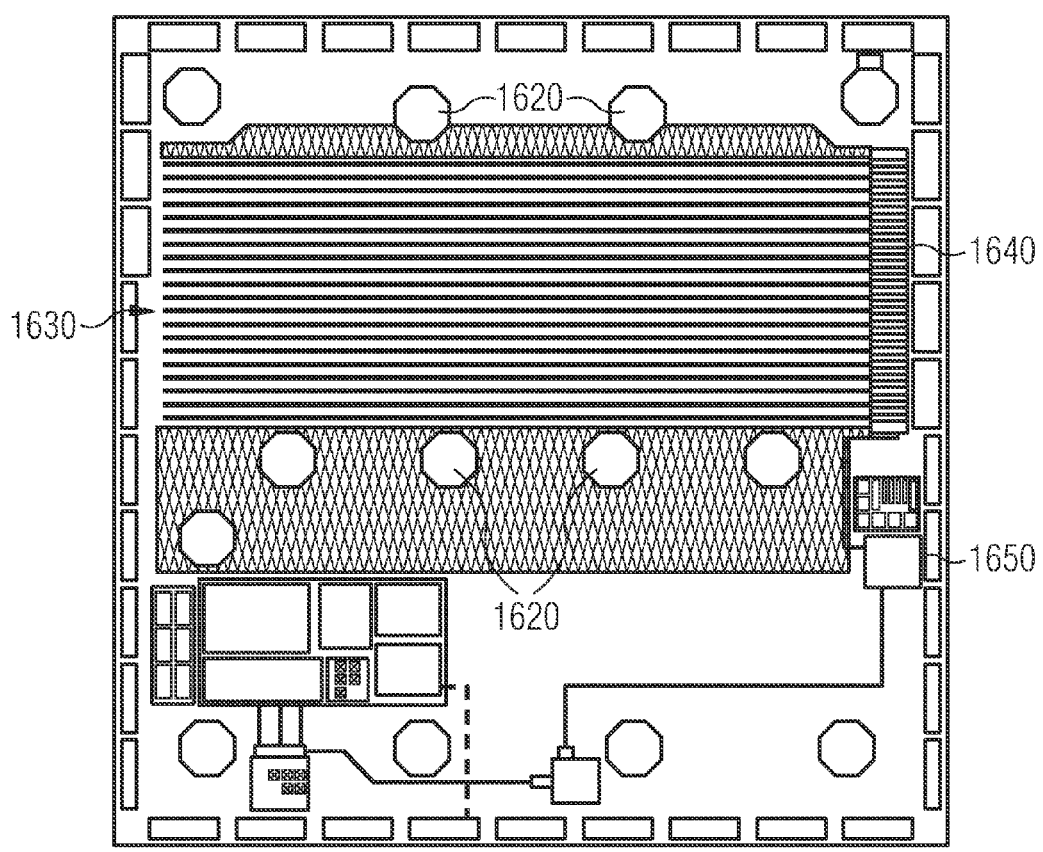
FIG. 16 shows a layout representation of a physical implementation of a circuit.

FIG. 16 shows a physical implementation of the circuit. The marked areas are occupied by discharge transistors 230, 240 and control units. Some connections of the RF-path as shown with reference number 1620. A series arrangement of 20 transistors which can be considered as switching elements is shown at reference numeral 1630. Comparatively smaller transistors, which serve as accelerating elements, are shown at reference numeral 1640. It can be seen that the transistors which serve as accelerating elements are arranged adjacent to the ends of gate stripes of the transistors forming the switching elements of the RF path. A control circuit for driving the accelerating elements (and, optionally, also the transistors which serve as RF path switching elements) is shown at reference numeral 1650.

Figure 17:
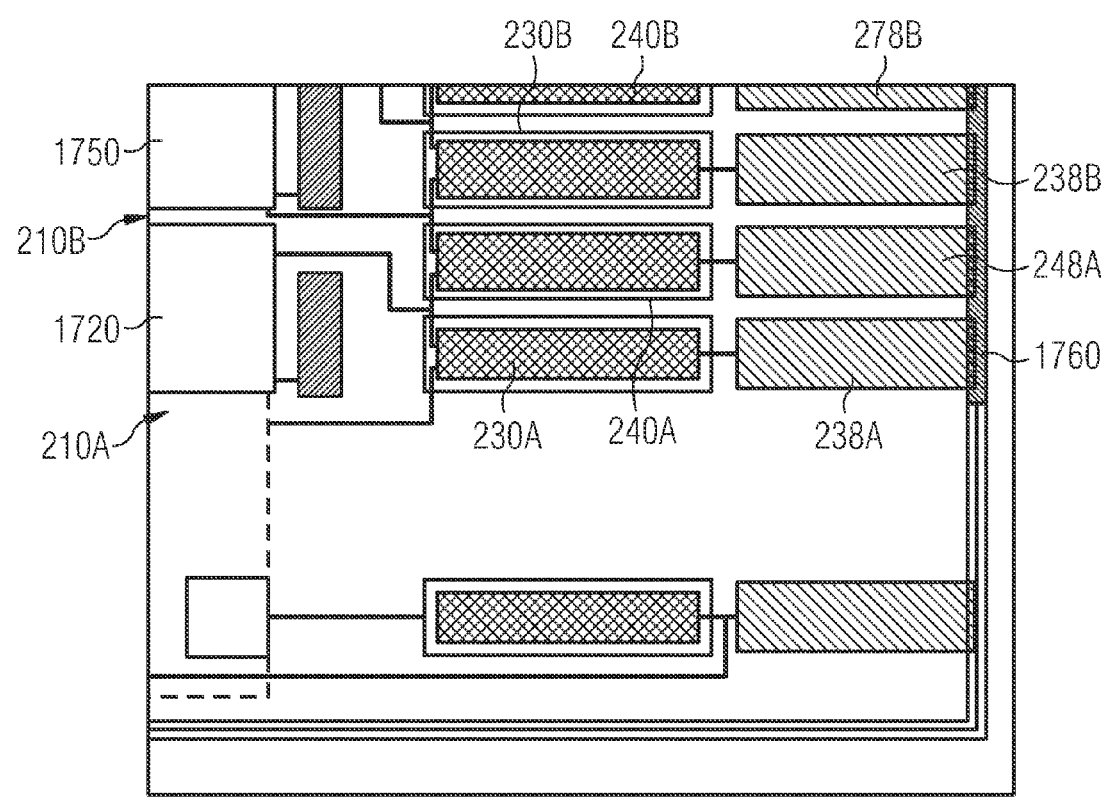
FIG. 17 shows an extract from a layout representation of a physical implementation with discharge transistors distributed along the switch transistors.

FIG. 17 shows a layout consideration. The discharge transistors 230A, 240A, 230A, 230B of the accelerating elements 130, 140 are placed separately and evenly distributed along the transistor of the switching element 210. For example, transistors 230A, 240A are associated with a first circuit 200A. A gate stripe 1720 of a transistor 210A forming a switching element associated with the first circuit 200A can also be seen. Moreover, transistors 230B, 240B, which form accelerating elements of a second circuit 200B are shown in FIG. 17, as well as a gate stripe 1750 of a transistor 210B associated with the second circuit 200B. Moreover, it can be seen that the transistors 230A, 240A, 230B, 240B are connected with a common control line 1760 via resistors 238A, 248A, 238B, 248B. The arrangement is based for small signal propagation time. Thereby a short switching times of the switching element 110 is achievable.

Figure 18:
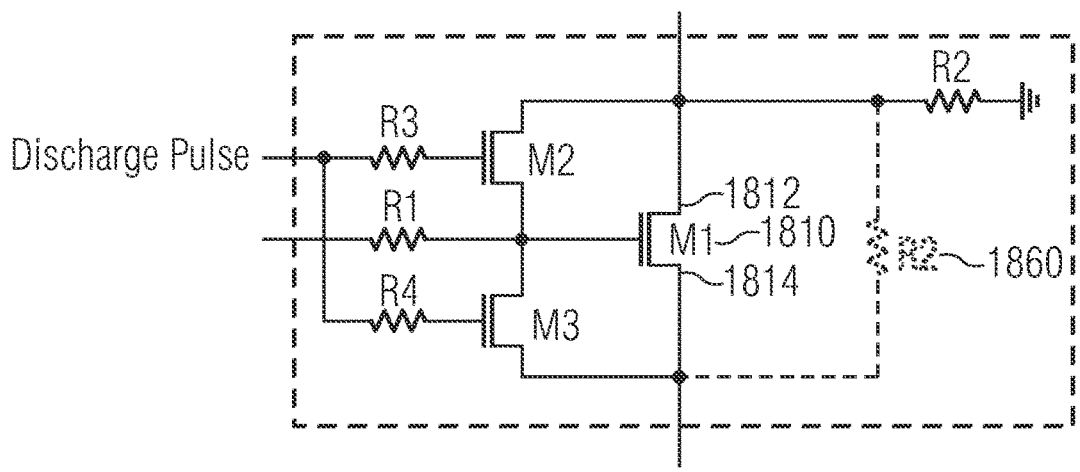
FIG. 18 shows a circuit diagram of a circuit 1800 according to an embodiment.

FIG. 18 shows a circuit diagram of a circuit 1800 according to an embodiment. Compared with circuit mentioned above, the circuit 1800 comprises an additional second resister R2 1860 between the first terminal 1812 and the second terminal 1814 of the switching element M1 1810. The second resistor R2 1860 can be shunt or M1 drain to source.

Figure 19:
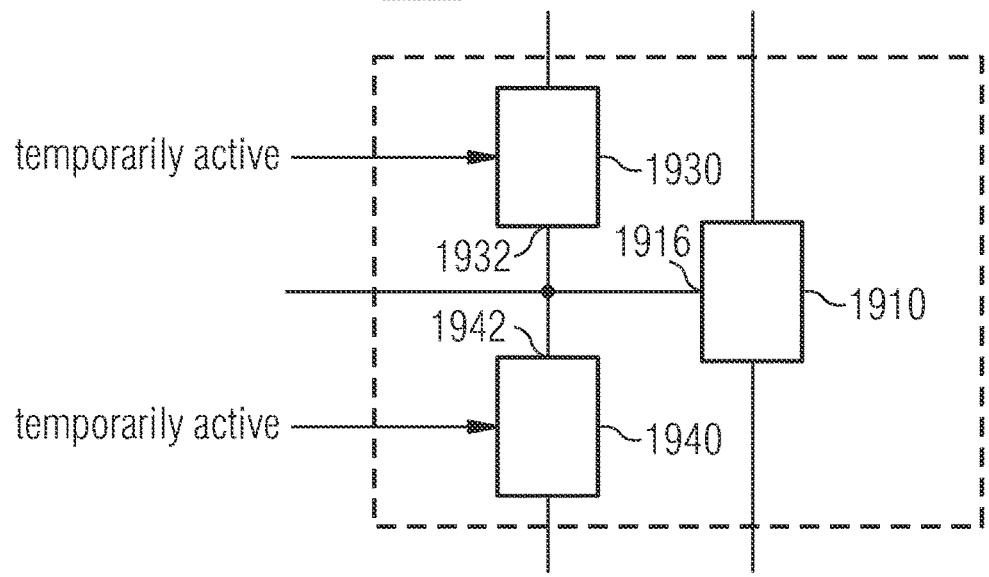
FIG. 19 shows a block diagram of a circuit 1900 according to an embodiment.

FIG. 19 shows a block diagram of a circuit 1900 according to an embodiment. The circuit 1900 comprises the switching element 1910. The first accelerating element 1930 is connected with a first terminal 1932 to the control terminal 1916 of the switching elements 1910. The first accelerating element 1930 is configured to temporarily charge or discharge the control terminal 1916 when a switching state of the switching element 1910 is to be changed. The second accelerating element 1940 is connected with a first terminal 1942 to the control terminal 1916 of the switching element 1910. The second accelerating element 1940 is configured to temporarily charge or discharge the control terminal 1916 when a switching state of the switching element 1910 is to be changed.

FIG. 20 shows a circuit diagram of a circuit 2000 according to an embodiment. The circuit 2000 comprises a first voltage source 2035 and a second voltage source 2045.

A positive potential terminal of the first voltage source 2035 is connected to a first terminal 2032 of the second transistor M2 and is connected, with a negative potential terminal, to the ground (which may, for example, be considered as a "first node"). The resistor R3 2038 is connected between the control terminal 2036 of the second transistor M2 and a charge pulse terminal 2022.

A negative potential terminal of the second voltage source 2045 is connected with a first terminal 2042 of the third transistor M3 and is further connected, with a positive potential terminal, to the ground. The resistor R4 2048 is connected between the control terminal 2046 of the third transistor M3 and a discharge pulse terminal 2020. A second resistor R2 2060 can be connected between the first terminal 2012 and a second terminal 2014 of the switching element M1 2010.

In place of one of the discharge pulse terminals as shown in the circuits mentioned above, the circuit 2000 comprises a charge pulse terminal 2022. The charge pulse terminal 2022 can be activated, to charge the control terminal 2016 of the switching element M1 2010 to a more positive potential compared with the ground. The discharge pulse terminal 2020 can be activated, to discharge the gate terminal 2016 of the switching element M1 2010 to a more negative potential compared with the ground. As a consequence, temporary charge injection can be done also with the voltage sources 2035, 2045, which serve as switched voltage sources 2035, 2045 in combination with switches (transistors) M2, M3.

FIG. 21 shows a circuit diagram of a circuit 2100 according to an embodiment. The circuit 2100 comprises two uni-polar current sources I1 2130, I2 2140. The current sources I1 2130, I2 2140 are connected to the control terminal 2116 of the switching element M1 2110. The current sources I1 2130, I2 2140 charge or discharge the control terminal 2116 of the switching element M1 2110. Optionally a second resistor R2 2160 can be connected between the first terminal 2112 and the second terminal 2114 of the switching element M1 2110. As a consequence, temporary charge injection can be done also with uni-polar current sources 2130, 2140.

Figure 22:
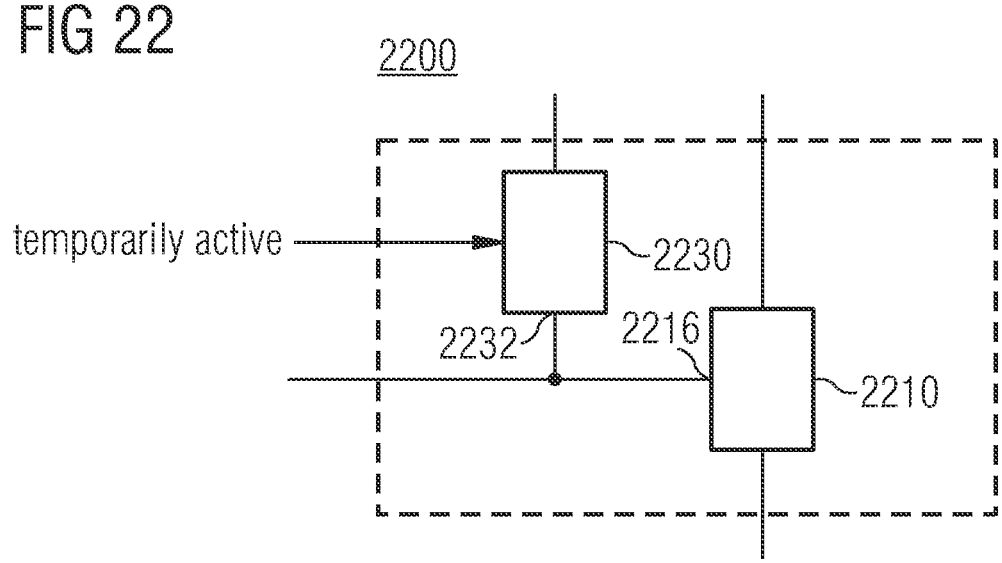
FIG. 22 shows a block diagram of a circuit 2200 according to an embodiment.

FIG. 22 shows a block diagram of a circuit 2200 according to an embodiment. In the circuit 2200, the first accelerating element 2230 is connected with the first terminal 2232 to the control terminal 2216 of the switching element 2210. The first accelerating element 2230 is configured to temporarily charge or discharge the control terminal 2216 when a switching state of the switching element 2210 is to be changed.

Figure 23:
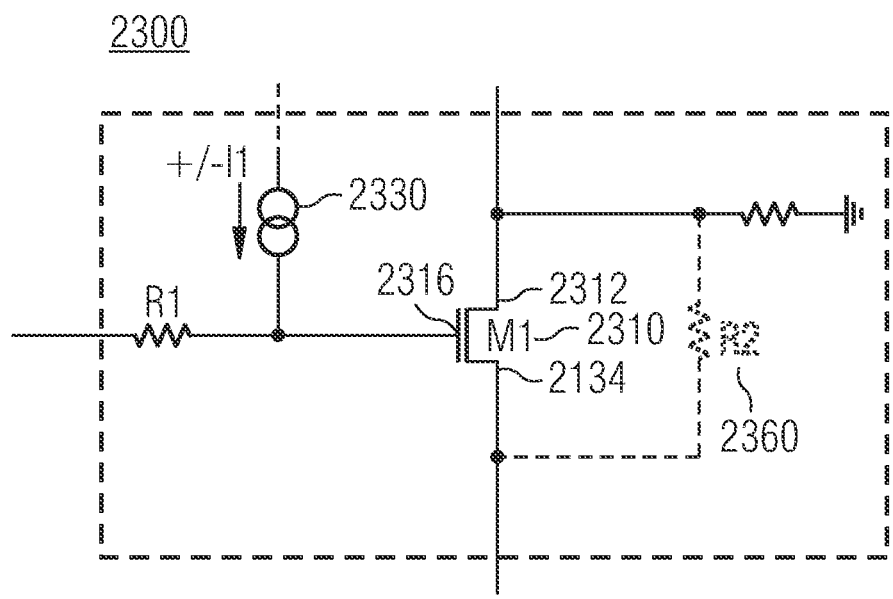
FIG. 23 shows a circuit diagram of a circuit 2300 according to an embodiment.

FIG. 23 shows a circuit diagram of a circuit 2300 according to an embodiment. The circuit 2300 comprises a unipolar current source I1 2330. The current source I1 2330 is connected to the control terminal 2316 of the switching element M1 2310. The current source I1 2330 can charge and discharge the gate terminal 2316 of the switching element M1 2310 with a positive or a negative current. Optionally a second resister R2 2360 can be connected between the first terminal 2312 and the second terminal 2314 of the switching element M1 2310. As a consequence, temporary charge injection can be done also with a bipolar (bi-directional) current source 2330.

Figure 24:
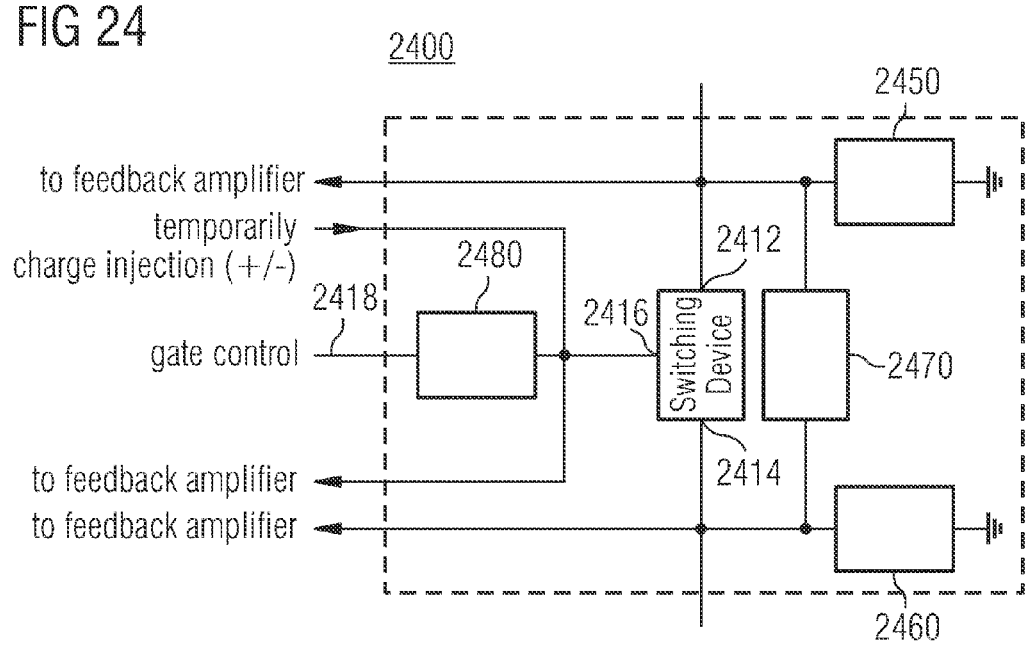
FIG. 24 shows a block diagram of a circuit 2400 according to an embodiment.

FIG. 24 shows a block diagram of a circuit 2400. The circuit 2400 comprises a first device 2450, which is connected between the first terminal 2412 of the switching element 2410 and the ground. A second device 2460 is connected between the second terminal 2414 of the switching element 2410 and the ground. A third device 2470 is connected between the first terminal 2412 and the second terminal 2414 of the switching element 2410. A fourth device 2480 is connected between the control terminal 2416 of the switching element 2410 and a switching node (gate control terminal) 2418. At least one of the first terminal 2412, the second terminal 2414 and the control terminal 2416 of the switching element 2410 are adapted to provide a signal to a feedback amplifier. The control terminal 2416 of the switching element 2410 is adapted to receive a temporary charge injection as a positive or negative voltage pulse or current pulse from the feedback amplifier.

Figure 25:
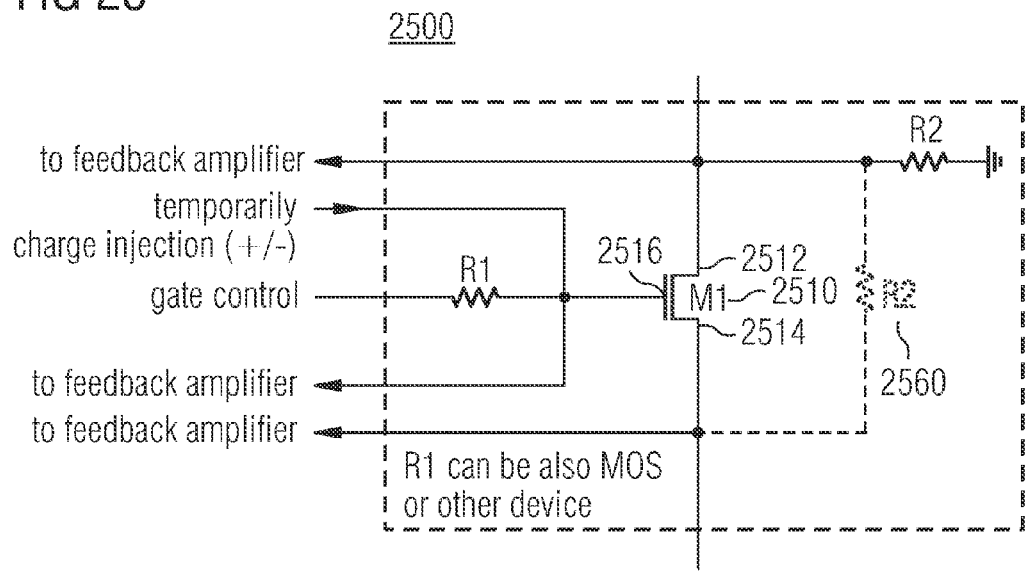
FIG. 25 shows a circuit diagram of a circuit 2500 according to an embodiment.

FIG. 25 shows a circuit diagram of a circuit 2500 according to an embodiment. A second resistor R2 2560 can be connected between the first terminal 2512 and the second terminal 2514 of the switching element M1 2510. The temporary charge injection is provided by a feedback amplifier as an accelerating element. The feedback amplifier is not shown in FIG. 25. The temporary injection, charge or discharge, depending on the polarity of the injection pulse, is applied to the gate terminal 2516 of the switching element M1 2510, when a switching state of the switching element is to be changed.

Figure 26:
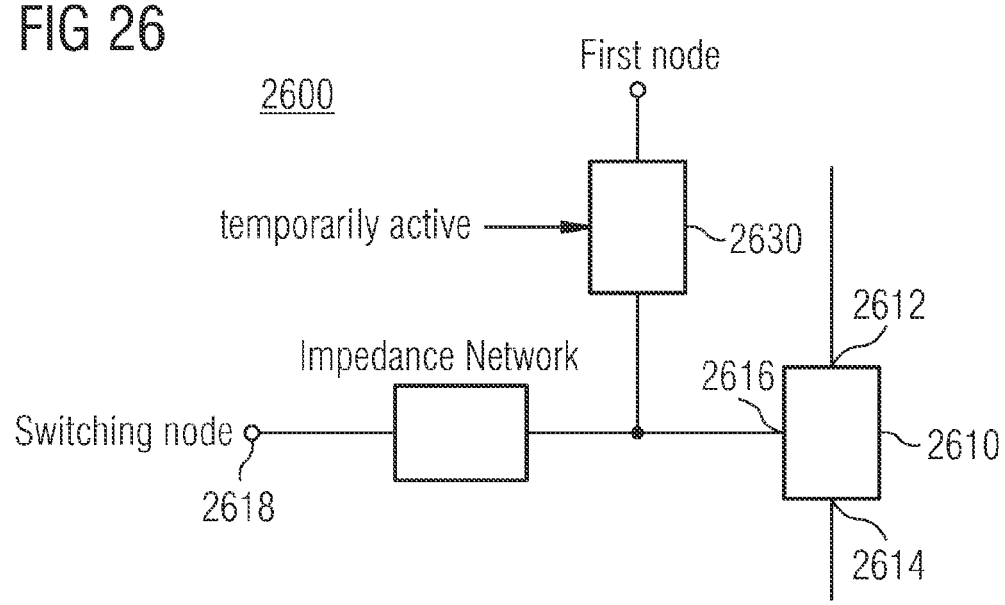
FIG. 26 shows a block diagram of a circuit 2600 according to an embodiment.

FIG. 26 shows a block diagram of a circuit 2600 according to an embodiment. The circuit 2600 comprises a switching element 2610 with a first terminal 2612, a second terminal 2614 and a control terminal 2616. An impedance network is coupled between the control terminal 2616 and a switching node 2618. A first accelerating element 2630 is coupled between the control terminal 2616 and a first node, the first node being different from the switching node 2618, wherein the circuit 2600 is configured to temporarily activate the first accelerating element 2630 when a switching state of the switching element 2610 is to be changed.

Figure 27:
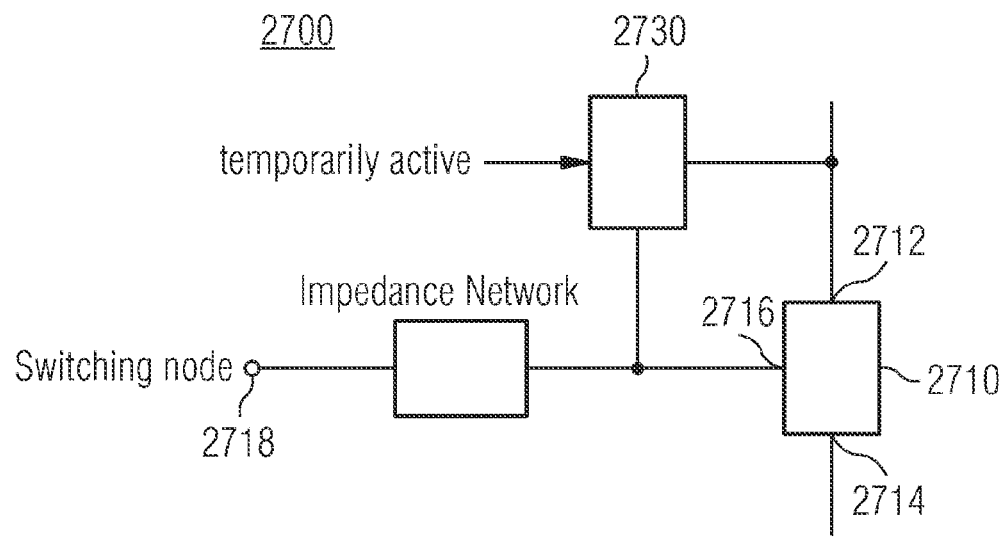
FIG. 27 shows a block diagram of a circuit 2700 according to an embodiment.

FIG. 27 shows a block diagram of a circuit 2700 according to an embodiment. Compared with FIG. 26, the first node, with which the accelerating element 2730 is coupled, is the first terminal 2712 of the switching element 2710.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a switching element with a first terminal, a second terminal and a control terminal;
    an impedance network coupled between the control terminal and a switching node for receiving a switching signal, wherein a state of the switching signal is determined by a state of a switch state signal; and
    a first accelerating element coupled between a node between the control terminal and the impedance network, and a first node, the first node being different from the switching node,
    wherein the circuit is configured to temporarily activate the first accelerating element using a pulse signal which is different from the switching signal when a switching state of the switching element is to be changed and in response to a transition of the switch state signal.

2. The circuit of claim 1, wherein the first node is the first terminal.

3. The circuit according to claim 1, wherein the first accelerating element is coupled with the first terminal to the control terminal of the switching element and is configured to temporarily charge or discharge the control terminal when a switching state of the switching element is to be changed, and wherein a second accelerating element is coupled with a second terminal to the control terminal of the switching element and is configured to temporarily charge or discharge the control terminal when a switching state of the switching element is to be changed.

4. The circuit according to claim 1, wherein the first accelerating element is coupled with the first terminal to the control terminal of the switching element and is configured to temporarily charge or discharge the control terminal when a switching state of the switching element is to be changed.

5. The circuit according to claim 1, wherein a first device is coupled between the first terminal of the switching element and a ground;
wherein a second device is coupled between the second terminal of the switching element and the ground; and
wherein a third device is coupled between the first terminal and the second terminal of the switching element, wherein at least one of the first terminal, the second terminal and the control terminal of the switching element are adapted to provide a signal to a feedback amplifier and wherein the control terminal of the switching element is adapted to receive a temporary charge injection from the feedback amplifier.

6. A circuit comprising:
a switching element with a first terminal, a second terminal and a control terminal; and
a first accelerating element coupled between the control terminal and the first terminal of the switching element,
wherein the circuit is configured to temporarily activate the first accelerating element to provide a connection between the first terminal and the control terminal when a switching state of the switching element is to be changed,
wherein the circuit is configured to:
temporarily activate the first accelerating element in response to a transition of a switch state signal,
provide a switching signal, which is coupled to the control terminal of the switching element via an impedance network, on a basis of the switch state signal, or
couple the switch state signal to the control terminal of the switching element via the impedance network, and
wherein the circuit is configured to provide the switching signal, which is coupled to the control terminal of the switching element via the impedance network, such that a state of the switching signal is determined by a state of the switch state signal.

7. The circuit according to claim 6, further comprising a second accelerating element coupled between the control terminal and the second terminal of the switching element, wherein the circuit is configured to temporarily activate the second accelerating element when a switching state of the switching element is to be changed.

8. The circuit according to claim 6, further comprising an impedance network coupled between the control terminal of the switching element and a control circuit for providing a switching signal.

9. The circuit according to claim 6, wherein the impedance network comprises a resistor, and wherein the first accelerating element is coupled between a node which is between the control terminal of the switching element and the resistor and the first terminal of the switching element.

10. The circuit according to claim 6, wherein the circuit is configured to generate a discharge pulse to temporarily activate the first accelerating element.

11. The circuit according to claim 7, wherein circuit is configured to generate a discharge pulse to temporarily activate the second accelerating element.

12. The circuit according to claim 6, wherein the first accelerating element is configured to bring a potential at the control terminal of the switching element to an intermediate potential, which is between an on-state control potential of the switching element and an off-state control potential of the switching element.

13. The circuit according to claim 12, wherein the intermediate potential is reached, within a tolerance of ±100 mV within a period of time which is smaller than an RC-time constant of a control resistor and a gate capacitance of the switching element, or which is smaller than one tenth of the RC-time constant, or which is smaller than 1/50 of the RC-time constant.

14. The circuit according to claim 6, wherein an on-resistance of the first accelerating element is smaller than a resistance of a resistor coupled at the control terminal of the switching element or smaller than 1/10 of the resistor coupled at the control terminal.

15. The circuit according to claim 7, wherein the first accelerating element is a second transistor and a control terminal of the second transistor is configured to receive a discharge control signal, and wherein the second accelerating element is a third transistor and a control terminal of said third transistor is configured to receive a discharge control signal.

16. The circuit according to claim 15, wherein the second transistor and the third transistor are both N-type unipolar transistors or both P-type unipolar transistors.

17. The circuit according to claim 15, wherein the control terminal of the second transistor and the control terminal of the third transistor are electrically coupled.

18. The circuit according to claim 6, wherein a resistor is coupled between the first terminal or the second terminal of the switching element and a reference potential.

19. The circuit according to claim 6, wherein the switching element is a unipolar transistor, a field-effect transistor (FET), or a metal-oxide-semiconductor field-effect-transistor (MOSFET), wherein a threshold voltage of said field-effect transistor is in a range between −0.7V and +0.7V.

20. The circuit according to claim 6, wherein the circuit comprises an inverting or non-inverting level converter configured to provide the switching signal on the basis of the switch state signal.

21. The circuit according to claim 7, wherein the circuit is configured to:
activate both the first accelerating element and the second accelerating element for a change from a first switching state of the switching element to a second switching state of the switching element, and
to activate both the first accelerating element and the second accelerating element for a change from the second switching state of the switching element to the first switching state of the switching element.

22. The circuit according to claim 6, wherein the circuit is configured to generate a discharge pulse during a time period which is long enough to discharge capacitances between the control terminal, the first terminal and the second terminal of the switching element down to less than 10% of an initial charge.

23. The circuit according to claim 22, wherein the circuit is configured to terminate the discharge pulse when a predetermined state has been reached by the first accelerating element.

24. The circuit according to claim 6, wherein the circuit comprise a RS flip-flop to provide a pulse to temporarily activate the first accelerating element, wherein the RS flip-flop is configured to be set when a switching state of the switching element is to be change, and wherein the RS flip-flop is configured to be reset when a predetermined state has been reached by the first accelerating element.

25. The circuit according to claim 24, wherein the circuit comprise an RC-Element which is configured to receive a control voltage for the first accelerating element and wherein the RS flip-flop is configured to be reset when capacitances of the RC-Element reaches or crosses a predetermined threshold voltage.

26. The circuit according to claim 25 wherein the capacitance of the RC-Element is formed by a transistor which is identical, except for a channel width, to a transistor forming the first accelerating element.

27. The circuit according to claim 6, wherein a channel width of a transistor of the first accelerating element is at least 40 times smaller than a channel width of a transistor of the switching element.

28. The circuit according to claim 6, wherein accelerating transistors of the first accelerating element are distributed along a transistor of the switching element.

29. A radio frequency switch comprising:
a first circuit according to claim 6; and
a second circuit according to claim 6,
wherein the switching element of the first circuit and the switching element of the second circuit are circuited in series.

30. The radio frequency switch according to claim 29, wherein the first terminal of the switching element of the first circuit is coupled to a reference potential via a first biasing device, such that the first terminal of the switching element of the first circuit is biased to the reference potential, wherein the second terminal of the switching element of the first circuit is coupled to the first terminal of the switching element of the second circuit, and wherein the first terminal of the switching element of the second circuit is coupled to the reference potential via a second biasing device, such that the first terminal of the switching element of the second circuit is biased to the reference potential.

31. The radio frequency switch according to claim 29, wherein the circuit is configured to simultaneously activate the accelerating elements of the first circuit and of the second circuit, and to simultaneously provide a switching signal to the first circuit and to the second circuit.

32. A circuit comprising:
means for switching with a first terminal and a second terminal for a radio frequency signal, and a control terminal;
means for short-circuiting the control terminal and the first terminal of the means for switching; and
means for resistively coupling the control terminal and a switching node for receiving a switching signal, wherein a state of the switching signal is determined by a state of a switch state signal,
wherein the circuit is configured to temporarily activate the means for short-circuiting when a switching state of the means for switching is to be changed and in response to a transition of the switch state signal.

33. A circuit comprising:
a field effect transistor (FET) with a drain terminal, a source terminal and a gate terminal;
a first accelerating element connected between the gate terminal and the drain terminal of the FET, the first accelerating element configured to provide a connection between the gate terminal and the drain terminal;
a second accelerating element connected between the gate terminal and the source terminal of the FET, the second accelerating element configured to provide a connection between the gate terminal and the source terminal;
an impedance network connected between the gate terminal of the FET and a control circuit for providing a switching signal; and
a resistor connected between the drain terminal of the FET and a reference potential,
wherein the circuit is configured to temporarily activate both the first accelerating element and the second accelerating element for a change from a first switching state of the FET to a second switching state of the FET, and to activate both the first accelerating element and the second accelerating element for a change from the second switching state of the FET to the first switching state of the FET.

34. A method for switching a circuit, wherein the circuit comprises a switching element with a first terminal, a second terminal and a control terminal, the method comprising:
temporally activating a first accelerating element, which is connected between a node, which node is between the control terminal and a resistor, and the first terminal of the switching element, to provide a connection between the control terminal and the first terminal, and/or a second accelerating element, which is connected between the node, which node is between the control terminal and the resistor, and the second terminal of the switching element, to provide a connection between the control terminal and the second terminal when a switching state of the switching element is to be changed, and wherein the resistor is coupled between the control terminal and a switching node for receiving a switching signal.

\* \* \* \* \*